(12) United States Patent
Lee et al.

(10) Patent No.: US 11,862,261 B2
(45) Date of Patent: Jan. 2, 2024

(54) METHOD OF WRITING DATA IN NONVOLATILE MEMORY DEVICE, NONVOLATILE MEMORY DEVICE PERFORMING THE SAME AND METHOD OF OPERATING MEMORY SYSTEM USING THE SAME

(71) Applicant: Samsung Electronics Co., Ltd., Suwon-si (KR)

(72) Inventors: Kwangwoo Lee, Seoul (KR); Chanha Kim, Hwaseong-si (KR); Heewon Lee, Seoul (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 10 days.

(21) Appl. No.: 17/393,797

(22) Filed: Aug. 4, 2021

(65) Prior Publication Data
US 2022/0172794 A1 Jun. 2, 2022

(30) Foreign Application Priority Data
Nov. 30, 2020 (KR) .................. 10-2020-0163790

(51) Int. Cl.
*G11C 16/34* (2006.01)
*G11C 16/26* (2006.01)
*G11C 16/10* (2006.01)

(52) U.S. Cl.
CPC ........ *G11C 16/3495* (2013.01); *G11C 16/102* (2013.01); *G11C 16/26* (2013.01); *G11C 16/3404* (2013.01)

(58) Field of Classification Search
CPC ... G11C 16/3495; G11C 16/102; G11C 16/26; G11C 16/3404; G11C 16/34; G11C 16/3422; G11C 16/3427; G11C 16/3431; G11C 16/3436; G11C 16/344; G11C 16/3445; G11C 16/345; G11C 16/3454; G11C 16/3459; G11C 16/3463; G11C 16/3468; G11C 16/3481; G11C 16/3486; G11C 16/349
See application file for complete search history.

(56) References Cited

U.S. PATENT DOCUMENTS

| | | |
|---|---|---|
| 7,489,558 B2 | 2/2009 | Choi et al. |
| 7,679,133 B2 | 3/2010 | Son et al. |
| 8,553,466 B2 | 10/2013 | Han et al. |
| 8,559,235 B2 | 10/2013 | Yoon et al. |
| 8,654,587 B2 | 2/2014 | Yoon et al. |
| 8,804,422 B2 | 8/2014 | Chung et al. |

(Continued)

*Primary Examiner* — Kretelia Graham
(74) *Attorney, Agent, or Firm* — Harness, Dickey & Pierce, P.L.C.

(57) ABSTRACT

In a method of writing data in a nonvolatile memory device, a write command, a write address and write data to be programmed are received. Offset information representing a verification level is received. The offset information is provided when the write data corresponds to a distribution deterioration pattern by checking an input/output (I/O) pattern of the write data. When the offset information is received, the write data is programmed based on the offset information such that at least one state among a plurality of states included in a distribution of threshold voltages of memory cells in which the write data is stored is changed.

19 Claims, 21 Drawing Sheets

(56) References Cited

U.S. PATENT DOCUMENTS

| | | | |
|---|---|---|---|
| 9,025,374 B2 * | 5/2015 | Yang | G06F 12/0246 |
| | | | 365/185.12 |
| 9,431,125 B2 * | 8/2016 | Alrod | G11C 16/10 |
| 9,666,249 B1 | 5/2017 | Park | |
| 10,109,353 B2 * | 10/2018 | Ueno | G11C 16/0483 |
| 10,431,316 B2 | 10/2019 | Jung | |
| 10,573,389 B2 | 2/2020 | Kim et al. | |
| 10,629,260 B2 | 4/2020 | Yang et al. | |
| 2011/0233648 A1 | 9/2011 | Seol et al. | |
| 2019/0362796 A1 * | 11/2019 | Choi | G11C 16/0483 |

* cited by examiner

METHOD OF WRITING DATA IN NONVOLATILE MEMORY DEVICE, NONVOLATILE MEMORY DEVICE PERFORMING THE SAME AND METHOD OF OPERATING MEMORY SYSTEM USING THE SAME

CROSS-REFERENCE TO RELATED APPLICATION

This application claims priority under 35 USC § 119 to Korean Patent Application No. 10-2020-0163790 filed on Nov. 30, 2020 in the Korean Intellectual Property Office (KIPO), the contents of which are herein incorporated by reference in their entirety.

BACKGROUND

1. Technical Field

Example embodiments relate generally to semiconductor integrated circuits, and more particularly to methods of writing data in nonvolatile memory devices, nonvolatile memory devices performing the methods of writing data, and methods of operating memory systems using the methods of writing data.

2. Description of the Related Art

Semiconductor memory devices can generally be divided into two categories depending upon whether or not they retain stored data when disconnected from a power supply. These categories include volatile memory devices, which lose stored data when disconnected from power, and nonvolatile memory devices, which retain stored data when disconnected from power. Volatile memory devices may perform read and write operations at a relatively high speed, while contents stored therein may be lost at power-off. Nonvolatile memory devices may retain contents stored therein even at power-off, which means they may be used to store data that must be retained regardless of whether they are powered.

Recently, as the degree of integration of nonvolatile memory devices increases, the reliability associated with deterioration and/or degradation of data stored in the nonvolatile memory devices is gradually reducing. Thus, various schemes of solving the deterioration problem have been researched.

SUMMARY

At least one example embodiment of the present disclosure provides a method of writing data in a nonvolatile memory device capable of improving and/or enhancing the reliability of data to be stored.

At least one example embodiment of the present disclosure provides a nonvolatile memory device performing the method of writing data.

At least one example embodiment of the present disclosure provides a method of operating a memory system using the method of writing data.

According to example embodiments, in a method of writing data in a nonvolatile memory device, a write command, a write address and write data to be programmed are received. Offset information representing a verification level is received. The offset information is provided when the write data corresponds to a predetermined or alternatively, desired distribution deterioration pattern by checking an input/output (I/O) pattern of the write data. When the offset information is received, the write data is programmed based on the offset information such that at least one state among a plurality of states included in a distribution of threshold voltages of memory cells in which the write data is stored is changed.

According to example embodiments, a nonvolatile memory device includes a memory cell array and processing circuitry. The memory cell array includes a plurality of memory cells. The processing circuitry receives a write command, a write address and write data to be programmed, receives offset information representing a verification level, and programs the write data based on the offset information when the offset information is received such that at least one state among a plurality of states included in a distribution of threshold voltages of memory cells in which the write data is stored is changed. The offset information is provided when the write data corresponds to a predetermined or alternatively, desired distribution deterioration pattern by checking an input/output (I/O) pattern of the write data.

According to example embodiments, in a method of operating a memory system including a memory controller and a nonvolatile memory device, a write command, a write address and write data to be programmed are transmitted by the memory controller to the nonvolatile memory device. An input/output (I/O) pattern of the write data is detected by the memory controller. An optimal or improved verification level is selected by the memory controller when it is determined that the write data is write cold data or read hot data. The write cold data is data that is written less than a predetermined or alternatively, desired first number of times. The read hot data is data that is read more than a predetermined or alternatively, desired second number of times. Offset information including the optimal or improved verification level is generated by the memory controller. The offset information is transmitted by the memory controller to the nonvolatile memory device. At least one of a first verification level through an N-th verification level is changed by the nonvolatile memory device based on the offset information. The first verification level through the N-th verification level correspond to a first state through an N-th state, respectively, that are included in a distribution of threshold voltages. A program loop is performed by the nonvolatile memory device once or more on the write data based on the first verification level through the N-th verification level such that at least one state among the first state through the N-th state is changed. The first state corresponds to a lowest voltage level, and the N-th state corresponds to a highest voltage level. When the write data is the write cold data, the at least one state is changed such that an interval between an (N−1)-th state and the N-th state increases. When the write data is the read hot data, the at least one state is changed such that an interval between the first state and a second state increases.

In the method of writing data, the nonvolatile memory device and the method of operating the memory system according to example embodiments, the I/O pattern of the write data to be programmed may be checked in real time or during runtime. When a specific or predetermined or alternatively, desired pattern is detected, a specific verification level may be adjusted or controlled such that the margin for specific states corresponding to the deterioration vulnerable to the specific pattern increases (e.g., such that an interval between adjacent states increases). Information associated with or related to the adjusted verification level may be provided as the offset information together with the write data. Accordingly, the deterioration of the write data may be efficiently reduced or prevented and the reliability may be improved or enhanced.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF EXAMPLE EMBODIMENTS

Figure 1:
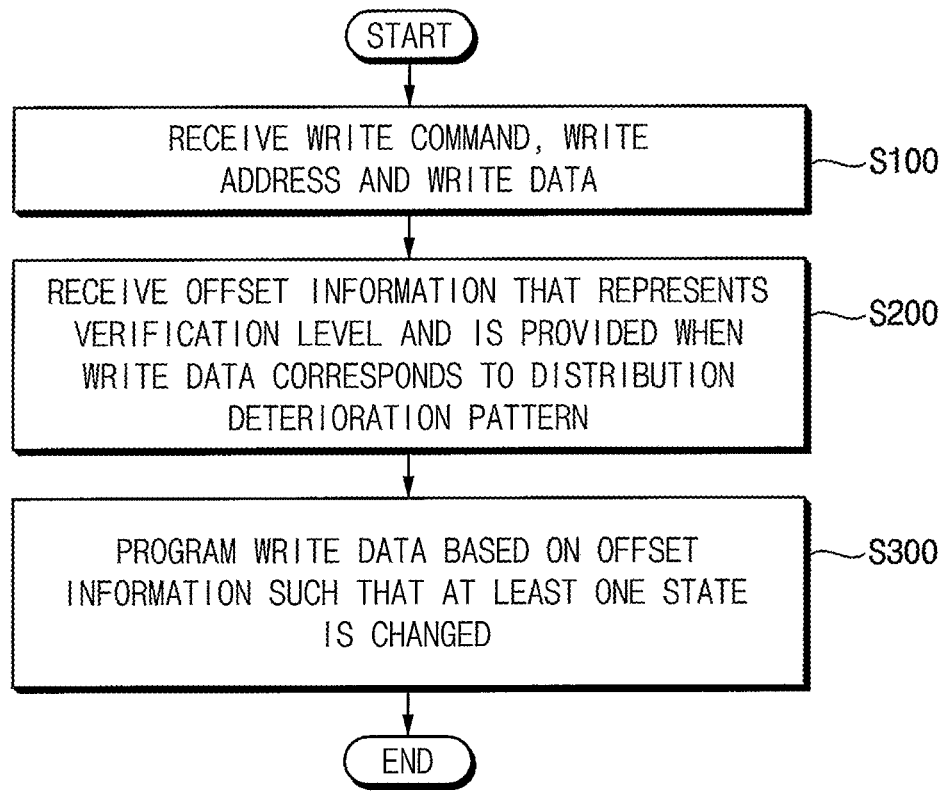
FIG. 1 is a flowchart illustrating a method of writing data in a nonvolatile memory device according to example embodiments.

Various example embodiments will be described more fully with reference to the accompanying drawings, in which example embodiments are shown. The present disclosure may, however, be embodied in many different forms and should not be construed as limited to example embodiments set forth herein. Like reference numerals refer to like elements throughout this application.

FIG. 1 is a flowchart illustrating a method of writing data in a nonvolatile memory device according to example embodiments.

Referring to FIG. 1, a method of writing data according to example embodiments is performed by a nonvolatile memory device that includes a plurality of memory cells. Detailed configurations of the nonvolatile memory device and a memory system including the nonvolatile memory device will be described with reference to FIGS. 2 through 7.

In the method of writing data in the nonvolatile memory device according to example embodiments, a write command, a write address and write data to be programmed are received (operation S100). For example, the write command, the write address and the write data may be transmitted from a memory controller included in the memory system to the nonvolatile memory device.

Offset information representing a verification level is received (operation S200). The offset information is provided when the write data corresponds to a predetermined or alternatively, desired distribution deterioration pattern by checking an input/output (I/O) pattern of the write data. For example, the memory controller may determine the I/O pattern of the write data, and the offset information generated as a result of the determination may be transmitted from the memory controller to the nonvolatile memory device.

In some example embodiments, the distribution deterioration pattern may include a first deterioration pattern associated with the data retention characteristic and a second deterioration pattern associated with the read disturbance characteristic. For example, when the write data is write cold data that is written or programmed less than a predetermined or alternatively, desired first number of times, it may be determined that the write data corresponds to the first deterioration pattern. For example, when the write data is read hot data that is read or retrieved more than a predetermined or alternatively, desired second number of times, it may be determined that the write data corresponds to the second deterioration pattern. Operation S200 will be described in detail with reference to FIG. 8.

Although FIG. 1 illustrates that operation S100 is performed and then operation S200 is performed, example embodiments are not limited thereto, and operations S100 and S200 may be substantially simultaneously or concurrently performed.

When the offset information is received, the write data is programed based on the offset information such that at least one state among a plurality of states included in a distribution of threshold voltages of memory cells in which the write data is stored is changed (operation S300). For example, the plurality of states may include a plurality of program states, and the write data may be programmed such that only some or a part of the plurality of program states is changed.

In some example embodiments, the plurality of states may include a first state through an N-th state, where N is a natural number greater than or equal to two. For example, the first state may correspond to the lowest voltage level, and the N-th state may correspond to the highest voltage level. For example, when the write data corresponds to the first deterioration pattern, the write data may be programmed such that an interval between an (N−1)-th state and the N-th state increases. For example, when the write data corresponds to the second deterioration pattern, the write data may be programmed such that an interval between the first state and a second state increases. Operation S300 will be described in detail with reference to FIGS. 9 through 20.

In a nonvolatile memory device such as a NAND flash memory device, data is maintained in the form of distribution (e.g., a distribution of cells or a distribution of threshold voltages of cells) when data is programmed. Such distribution varies or moves due to deterioration and/or degradation, and program parameters are set or controlled to overcome the variation of distribution. Among various program parameters, a verification level may be used to designate or set a starting position for each state in the distribution. If an interval (or gap) between verification levels of two adjacent states is relatively wide, it may represent that the margin for the distribution between the two adjacent states is relatively wide, and thus it may represent that the two adjacent states are relatively strong or robust in the deterioration that causes the variation of distribution. However, if all verification levels are fixed, it may be difficult to efficiently overcome all types of the deterioration that may occur on write data.

In the method of writing data in the nonvolatile memory device according to example embodiments, the I/O pattern of the write data to be programmed may be checked in real time or during runtime. When a specific or predetermined or alternatively, desired pattern is detected, a specific verification level may be adjusted or controlled such that the margin for specific states corresponding to the deterioration vulnerable to the specific pattern increases (e.g., such that an interval between adjacent states increases). Information associated with or related to the adjusted verification level may be provided as the offset information together with the write data. Accordingly, the deterioration of the write data may be efficiently reduced or prevented and the reliability may be improved or enhanced.

Figure 2:
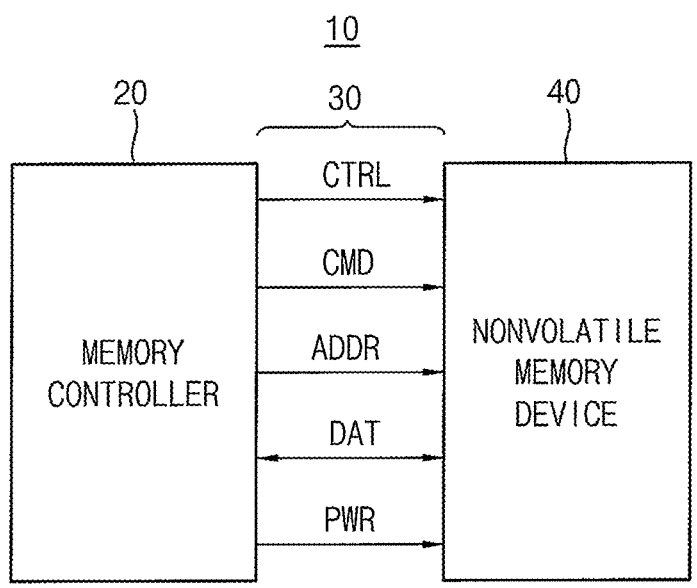
FIG. 2 is a block diagram illustrating a memory system according to example embodiments.

FIG. 2 is a block diagram illustrating a memory system according to example embodiments.

Referring to FIG. 2, a memory system 10 includes a memory controller 20 and a nonvolatile memory device 40. The memory system 10 may further include a plurality of signal lines 30 that electrically connect the memory controller 20 with the nonvolatile memory device 40.

The nonvolatile memory device 40 is controlled by the memory controller 20. For example, based on requests from a host device (e.g., a host device 1100 in FIG. 23), the memory controller 20 may store (e.g., write or program) data into the nonvolatile memory device 40, or may retrieve (e.g., read or sense) data from the nonvolatile memory device 40.

The plurality of signal lines 30 may include control lines, command lines, address lines, data input/output (I/O) lines and power lines. The memory controller 20 may transmit a command CMD, an address ADDR and a control signal CTRL to the nonvolatile memory device 40 via the command lines, the address lines and the control lines, may exchange a data signal DAT with the nonvolatile memory device 40 via the data I/O lines, and may transmit a power supply voltage PWR to the nonvolatile memory device 40 via the power lines. Although not illustrated in FIG. 2, the plurality of signal lines 30 may further include data strobe signal (DQS) lines for transmitting a DQS signal. In some example embodiments, at least a part or all of the plurality of signal lines 30 may be referred to as a channel.

Figure 3:
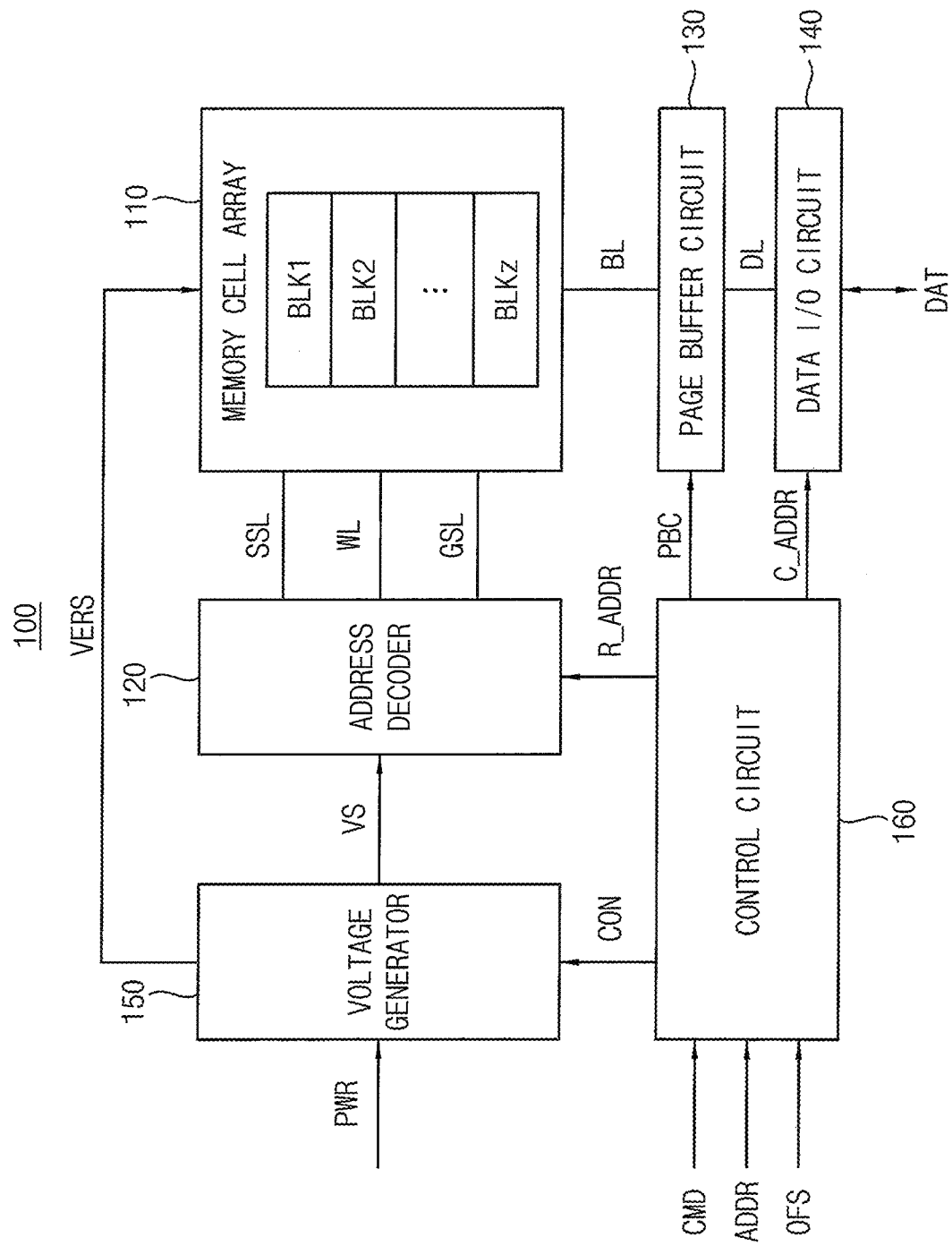
FIG. 3 is a block diagram illustrating a nonvolatile memory device according to example embodiments.

FIG. 3 is a block diagram illustrating a nonvolatile memory device according to example embodiments.

Referring to FIG. 3, a nonvolatile memory device 100 includes a memory cell array 110, an address decoder 120, a page buffer circuit 130, a data input/output (I/O) circuit 140, a voltage generator 150 and/or a control circuit 160.

The memory cell array 110 is connected to the address decoder 120 via a plurality of string selection lines SSL, a plurality of wordlines WL and a plurality of ground selection lines GSL. The memory cell array 110 is further connected to the page buffer circuit 130 via a plurality of bitlines BL. The memory cell array 110 may include a plurality of memory cells (e.g., a plurality of nonvolatile memory cells) that are connected to the plurality of wordlines WL and the plurality of bitlines BL. The memory cell array 110 may be divided into a plurality of memory blocks BLK1, BLK2, ..., BLKz each of which includes memory cells. In addition, each of the plurality of memory blocks BLK1, BLK2, ..., BLKz may be divided into a plurality of pages.

In some example embodiments, as will be described with reference to FIGS. 4 and 5, the memory cell array 110 may be a three-dimensional (3D) memory cell array, which is formed on a substrate in a three-dimensional structure (or a vertical structure). In some example embodiments, the memory cell array 110 may include a plurality of cell strings (e.g., a plurality of vertical NAND strings) that are vertically oriented such that at least one memory cell is located over another memory cell.

The control circuit 160 receives a command CMD and an address ADDR from an outside (e.g., from a memory controller), and control erasure, programming and read operations of the nonvolatile memory device 100 based on the command CMD and the address ADDR. An erasure operation may include performing a sequence of erase loops, and a program operation may include performing a sequence of program loops. Each program loop may include a program operation and a program verification operation. Each erase loop may include an erase operation and an erase verification operation. The read operation may include a normal read operation and data recover read operation.

For example, the control circuit 160 may generate control signals CON, which are used for controlling the voltage generator 150, and may generate control signal PBC for controlling the page buffer circuit 130, based on the command CMD, and may generate a row address R_ADDR and a column address C_ADDR based on the address ADDR. The control circuit 160 may provide the row address R_ADDR to the address decoder 120 and may provide the column address C_ADDR to the data I/O circuit 140.

The control circuit 160 may perform the method of writing data according to example embodiments described with reference to FIG. 1. For example, the control circuit 160 may receive offset information OFS that represents a verification level and is provided when write data corresponds to a predetermined or alternatively, desired distribution deterioration pattern, and may control the program loops of the nonvolatile memory device 100 based on the offset information OFS. In addition, the control circuit 160 may perform a method of writing data according to example embodiments which will be described with reference to FIGS. 21 and 22.

The address decoder 120 may be connected to the memory cell array 110 via the plurality of string selection lines SSL, the plurality of wordlines WL and the plurality of ground selection lines GSL.

For example, in the data erase/write/read operations, the address decoder 120 may determine at least one of the plurality of wordlines WL as a selected wordline, and may determine the rest or remainder of the plurality of wordlines WL other than the selected wordline as unselected wordlines, based on the row address R_ADDR.

In addition, in the data erase/write/read operations, the address decoder 120 may determine at least one of the plurality of string selection lines SSL as a selected string selection line, and may determine the rest or remainder of the plurality of string selection lines SSL other than the selected string selection line as unselected string selection lines, based on the row address R_ADDR.

Further, in the data erase/write/read operations, the address decoder 120 may determine at least one of the plurality of ground selection lines GSL as a selected ground selection line, and may determine the rest or remainder of the plurality of ground selection lines GSL other than the selected ground selection line as unselected ground selection lines, based on the row address R_ADDR.

The voltage generator 150 may generate voltages VS that are required for an operation of the nonvolatile memory device 100 based on a power PWR and the control signals CON. The voltages VS may be applied to the plurality of string selection lines SSL, the plurality of wordlines WL and the plurality of ground selection lines GSL via the address decoder 120. In addition, the voltage generator 150 may generate an erase voltage VERS that is required for the data erase operation based on the power PWR and the control signals CON. The erase voltage VERS may be applied to the memory cell array 110 directly or via the bitline BL.

For example, during the erase operation, the voltage generator 150 may apply the erase voltage VERS to a common source line and/or the bitline BL of a memory block (e.g., a selected memory block) and may apply an erase permission voltage (e.g., a ground voltage) to all wordlines of the memory block or a portion of the wordlines via the address decoder 120. In addition, during the erase verification operation, the voltage generator 150 may apply the erase verification voltage VEVFY simultaneously to all wordlines of the memory block or sequentially to the wordlines one by one.

For example, during the program operation, the voltage generator 150 may apply a program voltage to the selected wordline and may apply a program pass voltage to the unselected wordlines via the address decoder 120. In addition, during the program verification operation, the voltage generator 150 may apply a program verification voltage to the selected wordline and may apply a verification pass voltage to the unselected wordlines via the address decoder 120.

In addition, during the normal read operation, the voltage generator 150 may apply a read voltage to the selected wordline and may apply a read pass voltage to the unselected wordlines via the address decoder 120. During the data recover read operation, the voltage generator 150 may apply the read voltage to a wordline adjacent to the selected wordline and may apply a recover read voltage to the selected wordline via the address decoder 120.

The page buffer circuit 130 may be connected to the memory cell array 110 via the plurality of bitlines BL. The page buffer circuit 130 may include a plurality of page buffers. In some example embodiments, each page buffer may be connected to one bitline. In other example embodiments, each page buffer may be connected to two or more bitlines.

The page buffer circuit 130 may store data DAT to be programmed into the memory cell array 110 or may read data DAT sensed from the memory cell array 110. In other words, the page buffer circuit 130 may operate as a write driver or a sensing amplifier according to an operation mode of the nonvolatile memory device 100.

The data I/O circuit 140 may be connected to the page buffer circuit 130 via data lines DL. The data I/O circuit 140 may provide the data DAT from the outside of the nonvolatile memory device 100 to the memory cell array 110 via the page buffer circuit 130 or may provide the data DAT from the memory cell array 110 to the outside of the nonvolatile memory device 100, based on the column address C_ADDR.

Figure 4:
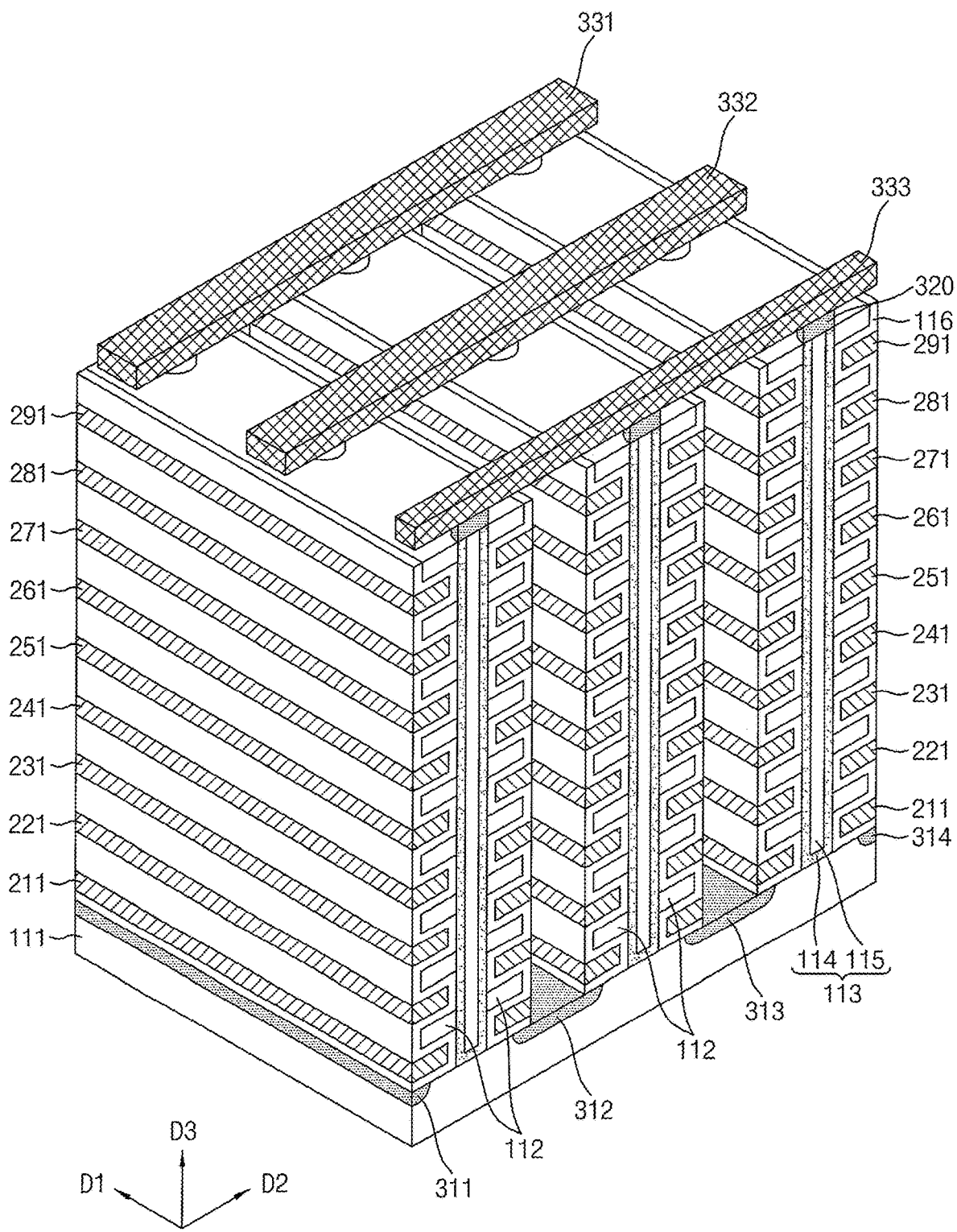
FIG. 4 is a perspective view of an example of a memory block included in a memory cell array included in a nonvolatile memory device of FIG. 3.

FIG. 4 is a perspective view of an example of a memory block included in a memory cell array included in a nonvolatile memory device of FIG. 3.

Referring to FIG. 4, a memory block BLKi includes a plurality of cell strings (e.g., a plurality of vertical NAND strings) which are formed on a substrate in a three-dimensional structure (or a vertical structure). The memory block BLKi includes structures extending along first, second and third directions D1, D2 and D3.

A substrate 111 is provided. For example, the substrate 111 may have a well of a first type of charge carrier impurity (e.g., a first conductivity type) therein. For example, the substrate 111 may have a p-well formed by implanting a group 3 element such as boron (B). In particular, the substrate 111 may have a pocket p-well provided within an n-well. In some example embodiments, the substrate 111 has a p-type well (or a p-type pocket well). However, the conductive type of the substrate 111 is not limited to p-type.

A plurality of doping regions 311, 312, 313 and 314 arranged along the second direction D2 are provided in/on the substrate 111. These plurality of doping regions 311 to 314 may have a second type of charge carrier impurity (e.g., a second conductivity type) different from the first type of the substrate 111. In some example embodiments according to the inventive concepts, the first to fourth doping regions 311 to 314 may have n-type. However, the conductive type of the first to fourth doping regions 311 to 314 is not limited to n-type.

A plurality of insulation materials 112 extending along the first direction D1 are sequentially provided along the third direction D3 on a region of the substrate 111 between the first and second doping regions 311 and 312. For example, the plurality of insulation materials 112 are provided along the third direction D3, being spaced by a specific distance. For example, the insulation materials 112 may include an insulation material such as an oxide layer.

A plurality of pillars 113 penetrating the insulation materials along the third direction D3 are sequentially disposed along the first direction D1 on a region of the substrate 111 between the first and second doping regions 311 and 312. For example, the plurality of pillars 113 penetrate the insulation materials 112 to contact the substrate 111.

In some example embodiments, each pillar 113 may include a plurality of materials. For example, a channel layer 114 of each pillar 113 may include a silicon material having a first conductivity type. For example, the channel layer 114 of each pillar 113 may include a silicon material having the same conductivity type as the substrate 111. In some example embodiments according to the inventive concepts, the channel layer 114 of each pillar 113 includes p-type silicon. However, the channel layer 114 of each pillar 113 is not limited to the p-type silicon.

An internal material 115 of each pillar 113 includes an insulation material. For example, the internal material 115 of each pillar 113 may include an insulation material such as a silicon oxide. In some examples, the internal material 115 of each pillar 113 may include an air gap. The term "air" as discussed herein, may refer to atmospheric air, or other gases that may be present during the manufacturing process.

An insulation layer 116 is provided along the exposed surfaces of the insulation materials 112, the pillars 113, and the substrate 111, on a region between the first and second doping regions 311 and 312. For example, the insulation layer 116 provided on surfaces of the insulation material 112 may be interposed between pillars 113 and a plurality of stacked first conductive materials 211, 221, 231, 241, 251, 261, 271, 281 and 291, as illustrated. In some examples, the insulation layer 116 need not be provided between the first conductive materials 211 to 291 corresponding to ground selection lines GSL (e.g., 211) and string selection lines SSL (e.g., 291). In some example embodiments, the ground selection lines GSL are the lowermost ones of the stack of first conductive materials 211 to 291 and the string selection lines SSL are the uppermost ones of the stack of first conductive materials 211 to 291.

The plurality of first conductive materials 211 to 291 are provided on surfaces of the insulation layer 116, in a region between the first and second doping regions 311 and 312. For example, the first conductive material 211 extending along the first direction D1 is provided between the insulation material 112 adjacent to the substrate 111 and the substrate 111. In more detail, the first conductive material 211 extending along the first direction D1 is provided between the insulation layer 116 at the bottom of the insulation material 112 adjacent to the substrate 111 and the substrate 111.

A first conductive material extending along the first direction D1 is provided between the insulation layer 116 at the top of the specific insulation material among the insulation materials 112 and the insulation layer 116 at the bottom of a specific insulation material among the insulation materials 112. For example, a plurality of first conductive materials 221 to 281 extending along the first direction D1 are provided between the insulation materials 112 and it may be understood that the insulation layer 116 is provided between the insulation materials 112 and the first conductive materials 221 to 281. The first conductive materials 211 to 291 may be formed of a conductive metal, but in other example embodiments according to the inventive concepts the first conductive materials 211 to 291 may include a conductive material such as a polysilicon.

The same structures as those on the first and second doping regions 311 and 312 may be provided in a region between the second and third doping regions 312 and 313. In the region between the second and third doping regions 312 and 313, a plurality of insulation materials 112 are provided, which extend along the first direction D1. And, a plurality of pillars 113 are provided that are disposed sequentially along the first direction D1 and penetrate the plurality of insulation materials 112 along the third direction D3. An insulation layer 116 is provided on the exposed surfaces of the plurality of insulation materials 112 and the plurality of pillars 113, and a plurality of first conductive materials 211 to 291 extend along the first direction D1. Similarly, the same structures as those on the first and second doping regions 311 and 312 may be provided in a region between the third and fourth doping regions 313 and 314.

A plurality of drain regions 320 are provided on the plurality of pillars 113, respectively. The drain regions 320 may include silicon materials doped with a second type of charge carrier impurity. For example, the drain regions 320 may include silicon materials doped with an n-type dopant. In some example embodiments according to the inventive concepts, the drain regions 320 include n-type silicon materials. However, the drain regions 320 are not limited to n-type silicon materials.

On the drain regions, a plurality of second conductive materials 331, 332 and 333 are provided, which extend along the second direction D2. The second conductive materials 331 to 333 are disposed along the first direction D1, being spaced apart from each other by a specific distance. The second conductive materials 331 to 333 are respectively connected to the drain regions 320 in a corresponding region. The drain regions 320 and the second conductive material 333 extending along the second direction D2 may be connected through each contact plug. Each contact plug may be, for example, a conductive plug formed of a conductive material such as a metal. The second conductive materials 331 to 333 may include metal materials. The second conductive materials 331 to 333 may include conductive materials such as a polysilicon.

In an example of FIG. 4, the first conductive materials 211 to 291 may be used to form the wordlines WL, the string selection lines SSL and the ground selection lines GSL. For example, the first conductive materials 221 to 281 may be used to form the wordlines WL, where conductive materials belonging to the same layer may be interconnected. The second conductive materials 331 to 333 may be used to form the bitlines BL. The number of layers of the first conductive materials 211 to 291 may be changed variously according to process and control techniques.

Figure 5:
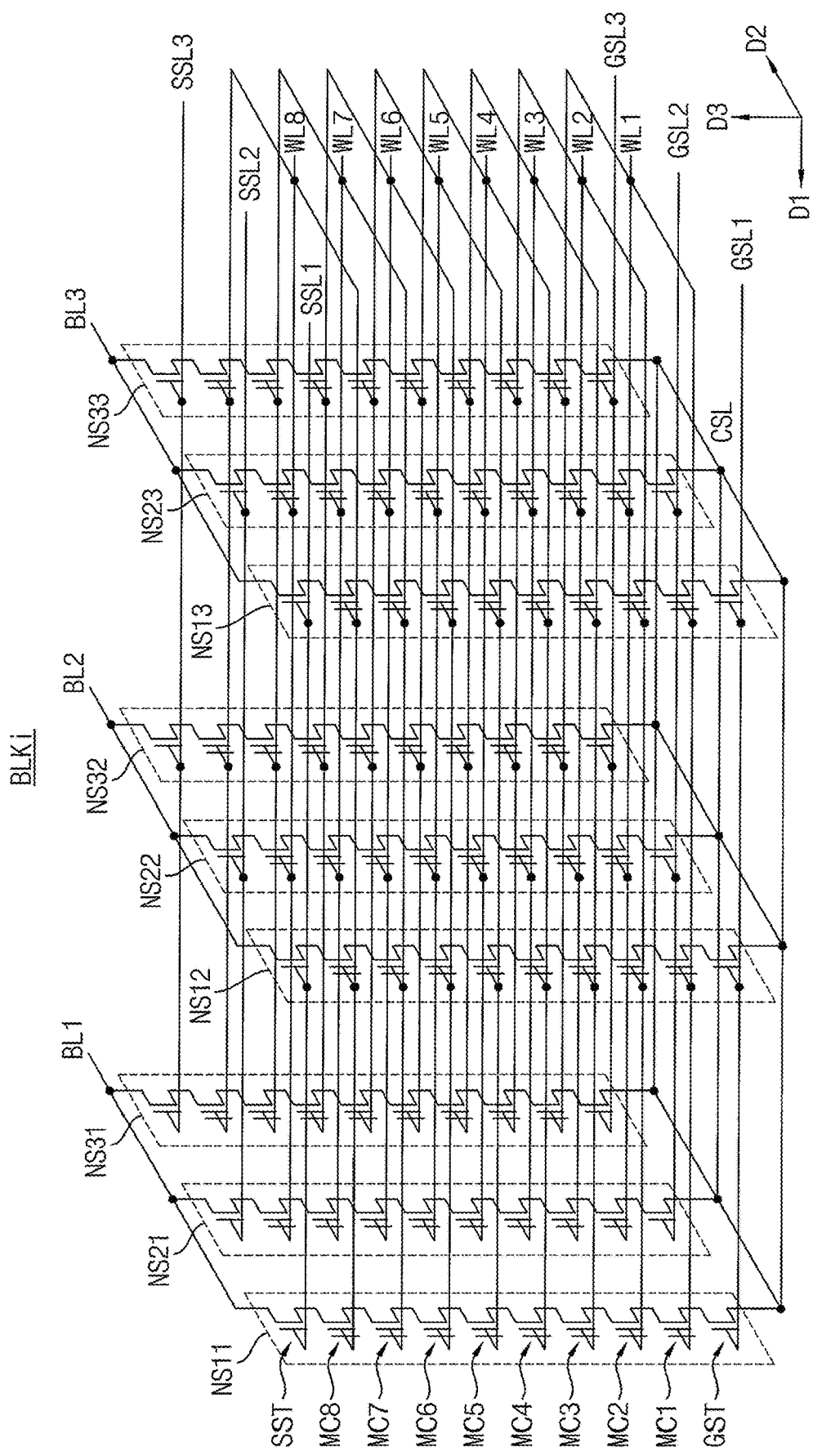
FIG. 5 is a circuit diagram illustrating an equivalent circuit of a memory block described with reference to FIG. 4.

FIG. 5 is a circuit diagram illustrating an equivalent circuit of a memory block described with reference to FIG. 4.

A memory block BLKi of FIG. 5 may be formed on a substrate in a three-dimensional structure (or a vertical structure). For example, a plurality of NAND strings included in the memory block BLKi may be formed in a direction perpendicular to the substrate.

Referring to FIG. 5, the memory block BLKi may include a plurality of NAND strings NS11, NS12, NS13, NS21, NS22, NS23, NS31, NS32 and NS33 connected between bitlines BL1, BL2 and BL3 and a common source line CSL. Each of the NAND strings NS11 to NS33 may include a string selection transistor SST, a plurality of memory cells MC1, MC2, MC3, MC4, MC5, MC6, MC7 and MC8, and a ground selection transistor GST. For example, the bitlines BL1 to BL3 may correspond to the second conductive materials 331 to 333 in FIG. 4, and the common source line CSL may be formed by interconnecting the first to fourth doping regions 311 to 314 in FIG. 4.

Each string selection transistor SST may be connected to a corresponding string selection line (one of SSL1, SSL2 and SSL3). The plurality of memory cells MC1 to MC8 may be connected to corresponding wordlines WL1, WL2, WL3, WL4, WL5, WL6, WL7 and WL8, respectively. Each ground selection transistor GST may be connected to a corresponding ground selection line (one of GSL1, GSL2 and GSL3). Each string selection transistor SST may be connected to a corresponding bitline (e.g., one of BL1 to BL3), and each ground selection transistor GST may be connected to the common source line CSL. In an example of FIG. 5, some of the string selection transistors SST are connected to the same bitline (e.g., one of BL1 to BL3) to connect corresponding NAND strings to the same bitline up appropriate selection via selection voltages applied to the appropriate sting selection lines SSL1 to SSL3 and ground selection lines GSL1 to GSL3.

The cell strings connected in common to one bitline may form one column, and the cell strings connected to one string selection line may form one row. For example, the cell strings NS11, NS21 and NS31 connected to the first bitline BL1 may correspond to a first column, and the cell strings NS11, NS12 and NS13 connected to the first string selection line SSL1 may form a first row.

Wordlines (e.g., WL1) having the same height may be commonly connected, and the ground selection lines GSL1 to GSL3 and the string selection lines SSL1 to SSL3 may be separated. Memory cells located at the same semiconductor layer share a wordline. Cell strings in the same row share a string selection line. The common source line CSL is connected in common to all of cell strings.

In FIG. 5, the memory block BLKi is illustrated to be connected to eight wordlines WL1 to WL8 and three bitlines BL1 to BL3, and each of the NAND strings NS11 to NS33 is illustrated to include eight memory cells MC1 to MC8. However, example embodiments are not limited thereto. In some example embodiments, each memory block may be connected to any number of wordlines and bitlines, and each NAND string may include any number of memory cells.

A three-dimensional vertical array structure may include vertical NAND strings that are vertically oriented such that at least one memory cell is located over another memory cell. The at least one memory cell may comprise a charge trap layer. The following patent documents, which are hereby incorporated by reference in their entirety, describe suitable configurations for a memory cell array including a 3D vertical array structure, in which the three-dimensional memory array is configured as a plurality of levels, with wordlines and/or bitlines shared between levels: U.S. Pat. Nos. 7,679,133; 8,553,466; 8,654,587; 8,559,235; and US Pat. Pub. No. 2011/0233648.

Although the memory cell array included in the nonvolatile memory device according to example embodiments is described based on a NAND flash memory device, the nonvolatile memory device according to example embodiments may be any nonvolatile memory device, e.g., a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), or the like.

Figure 6:
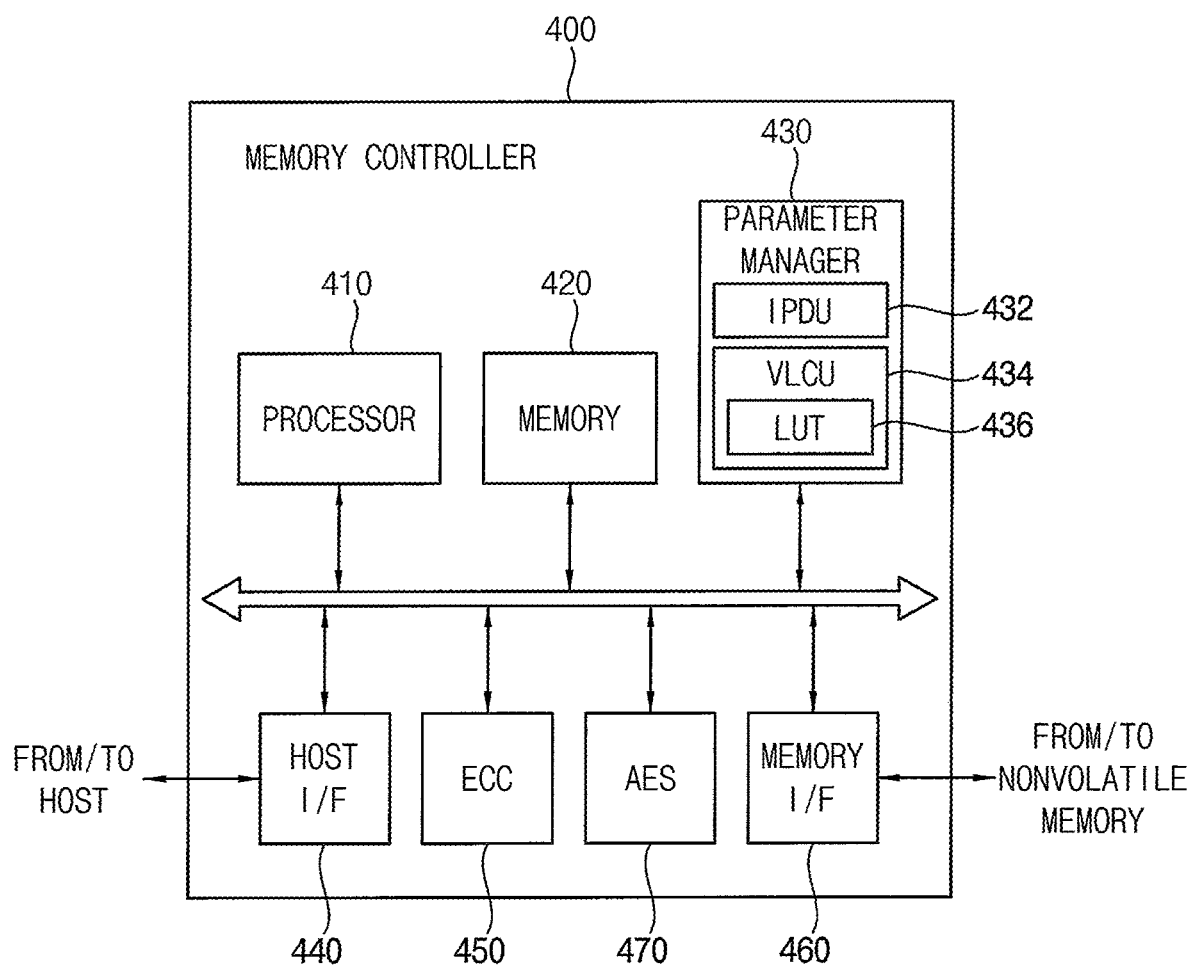
FIG. 6 is a block diagram illustrating an example of a memory controller included in a memory system according to example embodiments.

FIG. 6 is a block diagram illustrating an example of a memory controller included in a memory system according to example embodiments.

Referring to FIG. 6, a memory controller 400 may include a processor 410, a memory 420, a parameter manager 430, a host interface 440, an error correction code (ECC) engine 450, a memory interface 460 and/or an advanced encryption standard (AES) engine 470.

Figure 23:
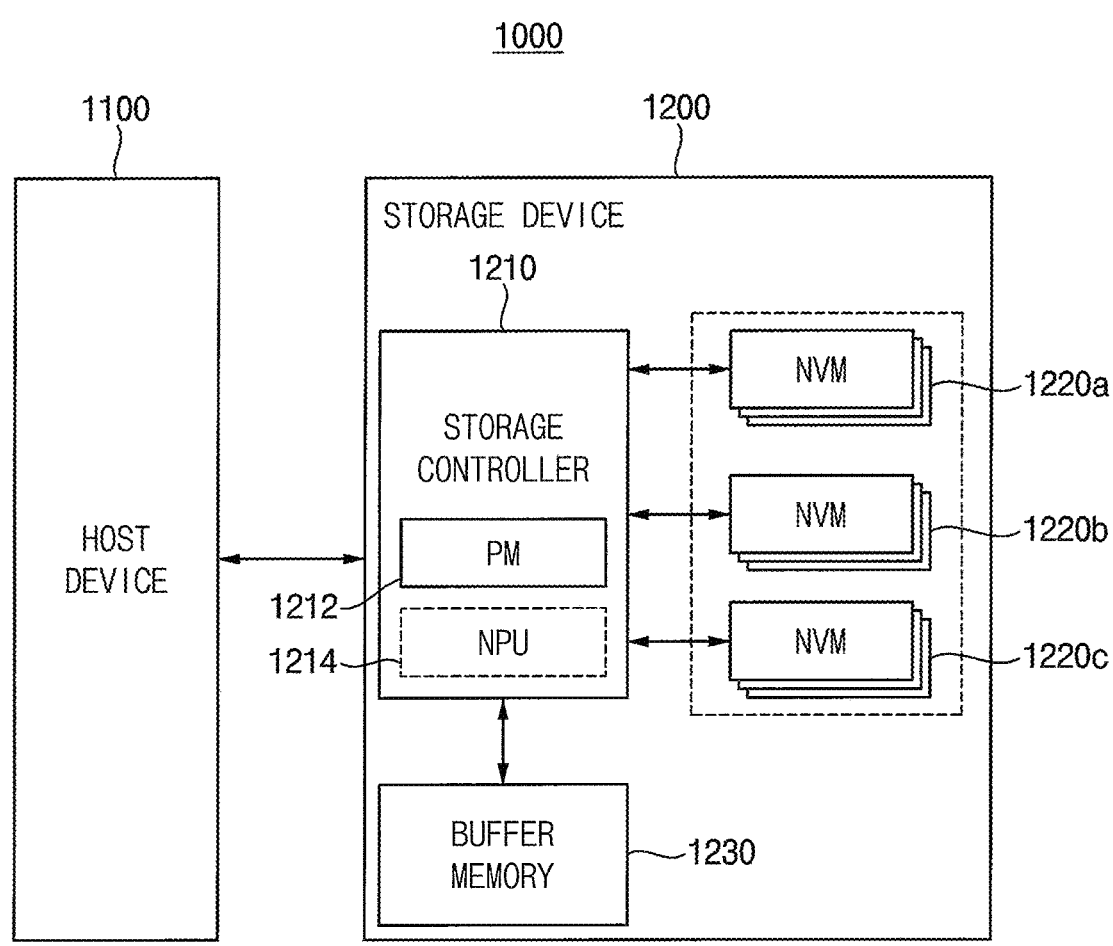
FIG. 23 is a block diagram illustrating a storage device and a storage system including the storage device according to example embodiments.

The processor 410 may control an operation of the memory controller 400 in response to a command received via the host interface 440 from a host device (e.g., the host device 1100 in FIG. 23). For example, the processor 410 may control an operation of a memory system (e.g., the memory system 10 of FIG. 2), and may control respective components by employing firmware for operating the memory system.

The memory 420 may store instructions and data executed and processed by the processor 410. For example, the memory 420 may be implemented with a volatile memory device, such as a dynamic random access memory (DRAM), a static random access memory (SRAM), a cache memory, or the like.

The parameter manager 430 may be used to perform the method of writing data according to example embodiments described with reference to FIG. 1. For example, the parameter manager 430 may perform operation S200 in FIG. 1. The parameter manager 430 may include an I/O pattern detection unit (IPDU) 432 that detects or senses an I/O pattern of write data, and a verification level control unit (VLCU) 434 that controls or adjusts a verification level. The verification level control unit 434 may include a preset (or predetermined or alternatively, desired) look-up table (LUT) 436 that is used to control or adjust the verification level. For example, the look-up table 436 may include a relationship between the I/O pattern of the write data and an optimal or improved verification level therefor. In some example embodiments, at least a part of the parameter manager 430 may be implemented as hardware. For example, at least a part of the parameter manager 430 may be included in a computer-based electronic system. In other example embodiments, at least a part of the parameter manager 430 may be implemented as instruction codes or program routines (e.g., a software program). For example, the instruction codes or the program routines may be executed by a computer-based electronic system, and may be stored in any storage device located inside or outside the computer-based electronic system.

The ECC engine 450 for error correction may perform coded modulation using a Bose-Chaudhuri-Hocquenghem (BCH) code, a low density parity check (LDPC) code, a turbo code, a Reed-Solomon code, a convolution code, a recursive systematic code (RSC), a trellis-coded modulation (TCM), a block coded modulation (BCM), etc., or may perform ECC encoding and ECC decoding using above-described codes or other error correction codes.

The host interface 440 may provide physical connections between the host device and the memory system. The host interface 440 may provide an interface corresponding to a bus format of the host device for communication between the host device and the memory system. In some example embodiments, the bus format of the host device may be a small computer system interface (SCSI) or a serial attached SCSI (SAS) interface. In other example embodiments, the bus format of the host device may be a USB, a peripheral component interconnect (PCI) express (PCIe), an advanced technology attachment (ATA), a parallel ATA (PATA), a serial ATA (SATA), a nonvolatile memory (NVM) express (NVMe), etc., format.

The memory interface 460 may exchange data with a nonvolatile memory device (e.g., the nonvolatile memory device 40 in FIG. 2). The memory interface 460 may transfer data to the nonvolatile memory device, or may receive data read from the nonvolatile memory device. In some example embodiments, the memory interface 460 may be connected to the nonvolatile memory device via one channel. In other example embodiments, the memory interface 460 may be connected to the nonvolatile memory device via two or more channels. For example, the memory interface 460 may be configured to comply with a standard protocol, such as Toggle or open NAND flash interface (ONFI).

The AES engine 470 may perform at least one of an encryption operation and a decryption operation on data input to the memory controller 400 by using a symmetric-key algorithm. Although not illustrated in detail, the AES engine 470 may include an encryption module and a decryption module. For example, the encryption module and the decryption module may be implemented as separate modules. For another example, one module capable of performing both encryption and decryption operations may be implemented in the AES engine 470.

Figure 7:
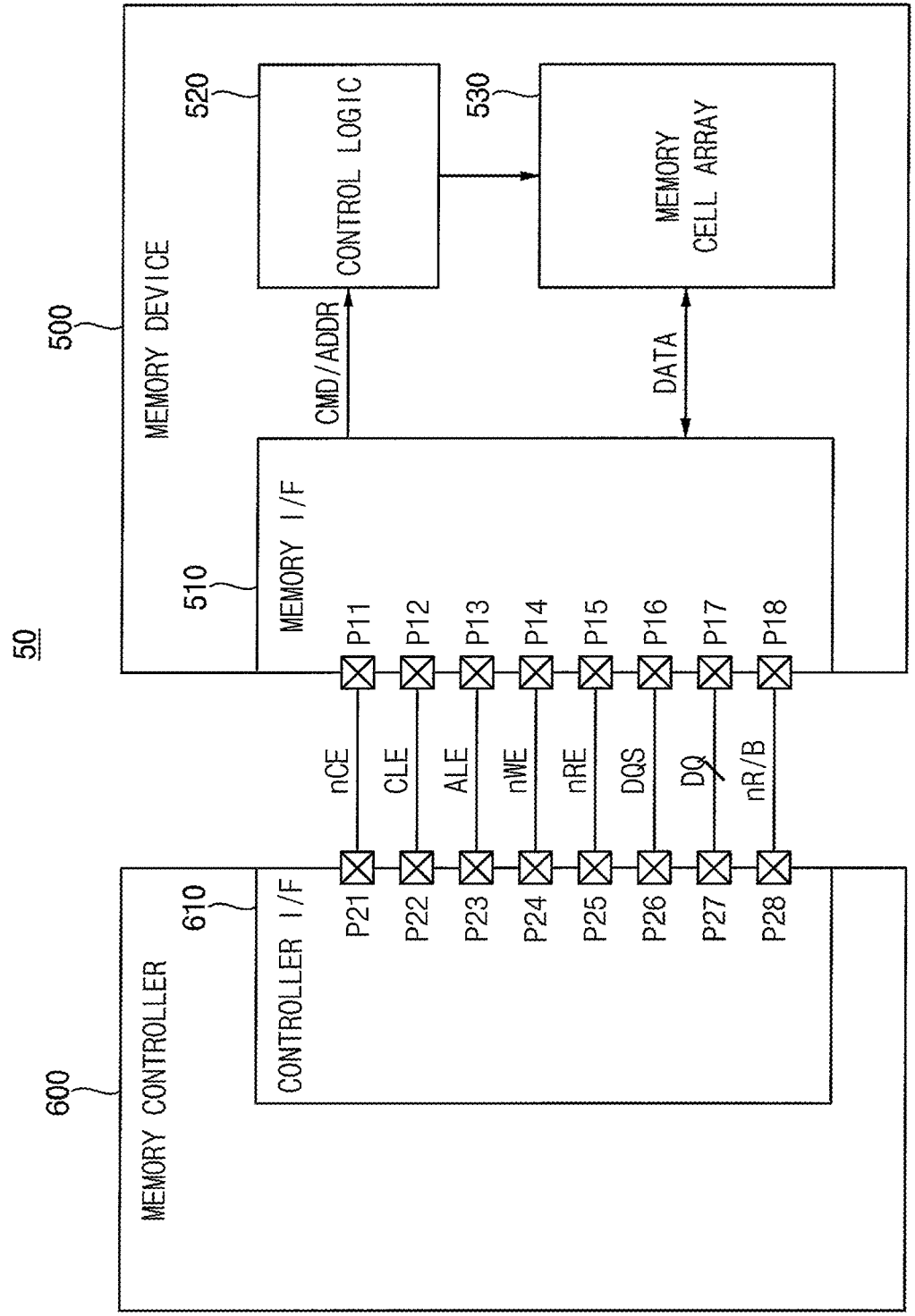
FIG. 7 is a block diagram illustrating a memory system according to example embodiments.

FIG. 7 is a block diagram illustrating a memory system according to example embodiments.

Referring to FIG. 7, a memory system 50 may include a memory device 500 and a memory controller 600. FIG. 7 illustrates an interface between the memory device 500 and the memory controller 600 in detail.

The memory device 500 may include first to eighth pins P11, P12, P13, P14, P15, P16, P17 and P18, a memory interface circuit 510, a control logic circuit 520 and a memory cell array 530.

The memory interface circuit 510 may receive a chip enable signal nCE from the memory controller 600 through the first pin P11. The memory interface circuit 510 may transmit and receive signals to and from the memory controller 600 through the second to eighth pins P12 to P18 in response to the chip enable signal nCE. For example, when the chip enable signal nCE is in an enable state (e.g., a low level), the memory interface circuit 510 may transmit and receive signals to and from the memory controller 600 through the second to eighth pins P12 to P18.

The memory interface circuit 510 may receive a command latch enable signal CLE, an address latch enable signal ALE and a write enable signal nWE from the memory controller 600 through the second to fourth pins P12 to P14. The memory interface circuit 510 may receive a data signal DQ from the memory controller 600 through the seventh pin P17 or may transmit the data signal DQ to the memory controller 600. A command CMD, an address ADDR and data DATA may be transmitted via the data signal DQ. For example, the data signal DQ may be transmitted through a plurality of data signal lines. In some example embodiments, the seventh pin P17 may include a plurality of pins respectively corresponding to a plurality of data signals DQ(s).

The memory interface circuit 510 may obtain the command CMD from the data signal DQ, which is received in an enable section (e.g., a high-level state) of the command latch enable signal CLE based on toggle time points of the write enable signal nWE. The memory interface circuit 510 may obtain the address ADDR from the data signal DQ, which is received in an enable section (e.g., a high-level state) of the address latch enable signal ALE based on the toggle time points of the write enable signal nWE.

In some example embodiments, the write enable signal nWE may be maintained at a static state (e.g., a high level or a low level) and may toggle between the high level and the low level. For example, the write enable signal nWE may toggle in a section in which the command CMD or the address ADDR is transmitted. Thus, the memory interface circuit 510 may obtain the command CMD or the address ADDR based on the toggle time points of the write enable signal nWE.

The memory interface circuit 510 may receive a read enable signal nRE from the memory controller 600 through the fifth pin P15. The memory interface circuit 510 may receive a data strobe signal DQS from the memory controller 600 through the sixth pin P16 or may transmit the data strobe signal DQS to the memory controller 600.

In a data output operation of the memory device 500, the memory interface circuit 510 may receive the read enable signal nRE, which toggles through the fifth pin P15, before outputting the data DATA. The memory interface circuit 510 may generate the data strobe signal DQS, which toggles based on the toggling of the read enable signal nRE. For example, the memory interface circuit 510 may generate the data strobe signal DQS, which starts toggling after a predetermined or alternatively, desired delay (e.g., tDQSRE), based on a toggling start time of the read enable signal nRE. The memory interface circuit 510 may transmit the data signal DQ including the data DATA based on a toggle time point of the data strobe signal DQS. Thus, the data DATA may be aligned with the toggle time point of the data strobe signal DQS and may be transmitted to the memory controller 600.

In a data input operation of the memory device 500, when the data signal DQ including the data DATA is received from the memory controller 600, the memory interface circuit 510 may receive the data strobe signal DQS, which toggles, along with the data DATA from the memory controller 600. The memory interface circuit 510 may obtain the data DATA from the data signal DQ based on toggle time points of the data strobe signal DQS. For example, the memory interface circuit 510 may sample the data signal DQ at rising and falling edges of the data strobe signal DQS and may obtain the data DATA.

In some example embodiments, the command CMD, the address ADDR and the data DATA that are obtained based on the write enable signal nWE and the data strobe signal DQS may correspond to a command, an address and data that are used to perform the data write operation according to example embodiments.

The memory interface circuit 510 may transmit a ready/busy output signal nR/B to the memory controller 600 through the eighth pin P18. The memory interface circuit 510 may transmit state information of the memory device 500 through the ready/busy output signal nR/B to the memory controller 600. When the memory device 500 is in a busy state (e.g., when operations are being performed in the memory device 500), the memory interface circuit 510 may transmit the ready/busy output signal nR/B indicating the busy state to the memory controller 600. When the memory device 500 is in a ready state (e.g., when operations are not performed or are completed in the memory device 500), the memory interface circuit 510 may transmit the ready/busy output signal nR/B indicating the ready state to the memory controller 600. For example, while the memory device 500 is reading the data DATA from the memory cell array 530 in response to a page read command, the memory interface circuit 510 may transmit the ready/busy output signal nR/B indicating the busy state (e.g., a low level) to the memory controller 600. For example, while the memory device 500 is programming the data DATA to the memory cell array 530 in response to a program command, the memory interface circuit 510 may transmit the ready/busy output signal nR/B indicating the busy state to the memory controller 600.

The control logic circuit 520 may control overall operations of the memory device 500. The control logic circuit 520 may receive the command CMD and the address ADDR obtained from the memory interface circuit 510. The control logic circuit 520 may generate control signals for controlling other components of the memory device 500 in response to the received command CMD and the received address ADDR. For example, the control logic circuit 520 may generate various control signals for programming the data DATA to the memory cell array 530 or for reading the data DATA from the memory cell array 530.

The memory cell array 530 may store the data DATA obtained from the memory interface circuit 510, under the control of the control logic circuit 520. The memory cell array 530 may output the stored data DATA to the memory interface circuit 510 under the control of the control logic circuit 520.

The memory cell array 530 may include a plurality of memory cells. For example, the plurality of memory cells may be flash memory cells. However, example embodiments are not limited thereto, and the memory cells may be RRAM cells, FRAM cells, PRAM cells, thyristor RAM (TRAM) cells, MRAM cells, or the like. Hereinafter, an example in which the memory cells are NAND flash memory cells will mainly be described.

The memory controller 600 may include first to eighth pins P21, P22, P23, P24, P25, P26, P27 and P28 and a controller interface circuit 610. The first to eighth pins P21 to P28 may correspond to the first to eighth pins P11 to P18 of the memory device 500, respectively.

The controller interface circuit 610 may transmit the chip enable signal nCE to the memory device 500 through the first pin P21. The controller interface circuit 610 may transmit and receive signals to and from the memory device 500, which is selected by the chip enable signal nCE, through the second to eighth pins P22 to P28.

The controller interface circuit 610 may transmit the command latch enable signal CLE, the address latch enable signal ALE and the write enable signal nWE to the memory device 500 through the second to fourth pins P22 to P24. The controller interface circuit 610 may transmit or receive the data signal DQ to and from the memory device 500 through the seventh pin P27.

The controller interface circuit 610 may transmit the data signal DQ including the command CMD or the address ADDR to the memory device 500 along with the write enable signal nWE, which toggles. The controller interface circuit 610 may transmit the data signal DQ including the command CMD to the memory device 500 by transmitting the command latch enable signal CLE having an enable state. Also, the controller interface circuit 610 may transmit the data signal DQ including the address ADDR to the memory device 500 by transmitting the address latch enable signal ALE having an enable state.

The controller interface circuit 610 may transmit the read enable signal nRE to the memory device 500 through the fifth pin P25. The controller interface circuit 610 may receive or transmit the data strobe signal DQS from or to the memory device 500 through the sixth pin P26.

In the data output operation of the memory device 500, the controller interface circuit 610 may generate the read enable signal nRE, which toggles, and may transmit the read enable signal nRE to the memory device 500. For example, before outputting the data DATA, the controller interface circuit 610 may generate the read enable signal nRE, which is changed from a static state (e.g., a high level or a low level) to a toggling state. Thus, the memory device 500 may generate the data strobe signal DQS, which toggles, based on the read enable signal nRE. The controller interface circuit 610 may receive the data signal DQ including the data DATA along with the data strobe signal DQS, which toggles, from the memory device 500. The controller interface circuit 610 may obtain the data DATA from the data signal DQ based on a toggle time point of the data strobe signal DQS.

In the data input operation of the memory device 500, the controller interface circuit 610 may generate the data strobe signal DQS, which toggles. For example, before transmitting the data DATA, the controller interface circuit 610 may generate the data strobe signal DQS, which is changed from a static state (e.g., a high level or a low level) to a toggling state. The controller interface circuit 610 may transmit the data signal DQ including the data DATA to the memory device 500 based on toggle time points of the data strobe signal DQS.

The controller interface circuit 610 may receive the ready/busy output signal nR/B from the memory device 500 through the eighth pin P28. The controller interface circuit 610 may determine state information of the memory device 500 based on the ready/busy output signal nR/B.

Figure 8:
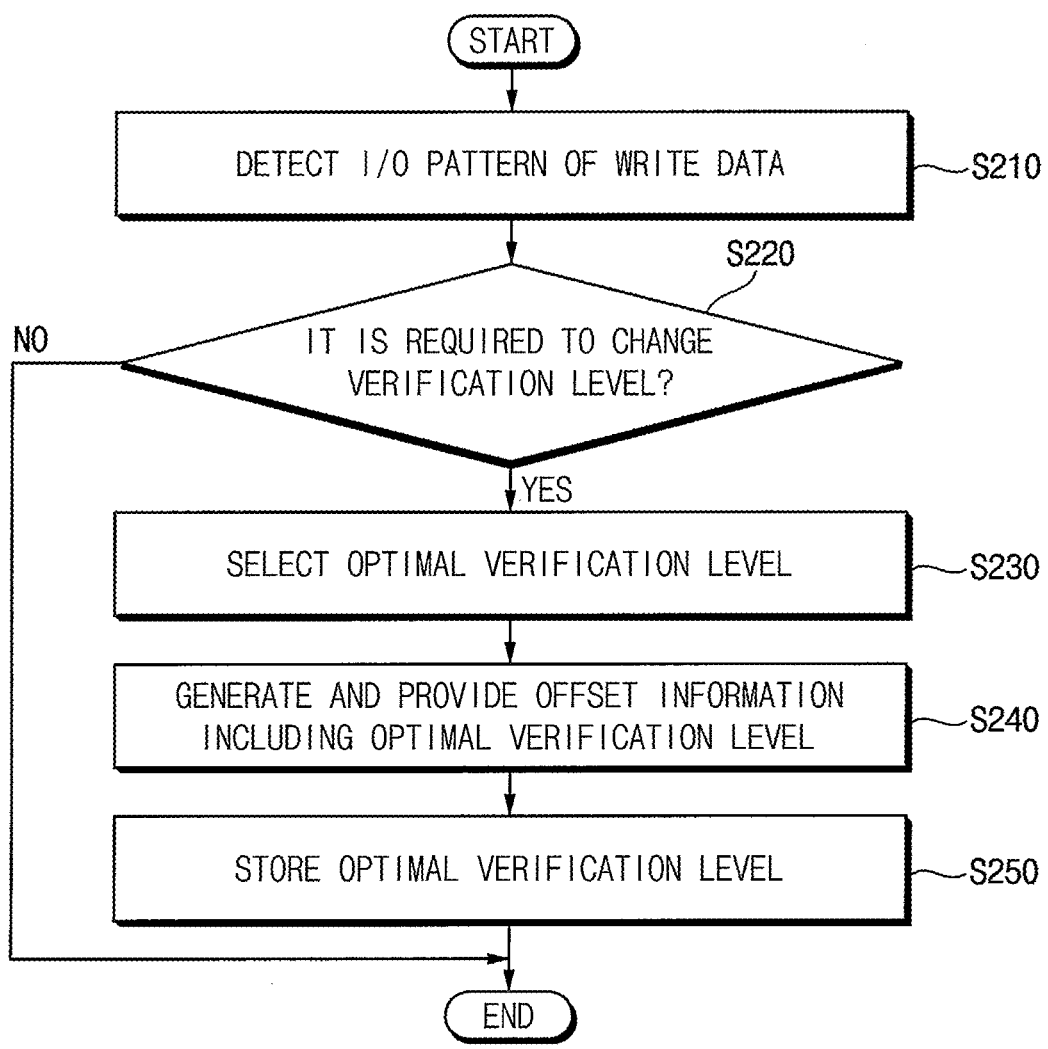
FIG. 8 is a flowchart illustrating an example of receiving offset information in FIG. 1.

FIG. 8 is a flowchart illustrating an example of receiving offset information in FIG. 1.

Referring to FIGS. 1 and 8, in operation S200, the I/O pattern of the write data may be detected (operation S210). For example, operation S210 may be performed by the I/O pattern detection unit 432 in FIG. 6.

In some example embodiments, the I/O pattern of the write data may be detected based on the write address. For example, the I/O pattern of the write data may be recognized or identified depending on the locality (or hotness) of the write address tracked in real time (or during runtime). For example, the locality of the write address may be checked using a counter. For another example, the locality of the write address may be tracked and/or predicted using various machine learning schemes. For example, as will be described with reference to FIG. 23, a neural processing unit (NPU) for performing the machine learning may be used.

In other example embodiments, the I/O pattern of the write data may be detected based on the number of times the write data is accessed. For example, the I/O pattern of the write data may be recognized or identified depending on an access pattern tracked in real time. For example, when the number of access times (or access frequency) of a specific data is relatively high (e.g., higher than the reference number of times), the data may be classified as hot data. When the number of access times of a specific data is relatively low (e.g., lower than the reference number of times), the data may be classified as cold data.

When the write data corresponds to the distribution deterioration pattern and it is required to change the verification level (operation S220: YES), an optimal or improved verification level may be selected (operation S230), and the offset information including the optimal or improved verification level may be generated and provided (operation S240). For example, operations S220, S230 and S240 may be performed by the verification level control unit 434 and the look-up table 436 in FIG. 6.

In some example embodiments, the I/O pattern of the write data may include write hot data, write cold data, read hot data and read cold data that are classified depending on the address, the locality of data and/or the number of access times of data.

In some example embodiments, the deterioration of distribution may include the data retention deterioration and the read disturbance deterioration. The data retention deterioration may affect an upper state among a plurality of states included in a distribution of threshold voltages of memory cells, and the read disturbance deterioration may affect a lower state among the plurality of states. In other words, the upper state may vary or may be changed due to the data retention deterioration, and the lower state may vary or may be changed due to the read disturbance deterioration. The distribution deterioration pattern may include the first deterioration pattern vulnerable (or weak) to the data retention deterioration and the second deterioration pattern vulnerable to the read disturbance deterioration.

In some example embodiments, when the write data is the write cold data, e.g., when a write operation for the write address is performed with a relatively small number of times, it may be determined that the write data corresponds to the first deterioration pattern, and thus a specific verification level may be changed (e.g., the optimal or improved verification level may be re-selected) to improve and/or enhance the reliability of the write data. The write cold data may be data that is to be maintained or left in a storage space for a relatively long time, and a probability of being exposed to the data retention deterioration may be relatively high. Therefore, the reliability of the write cold data may be improved when the write cold data is more resistant or robust to the data retention deterioration. As described above, the data retention deterioration may affect the upper state, and thus, for the write cold data, the verification level may be controlled or adjusted to increase the margin for the upper state. Detailed operations of adjusting the verification level for the write cold data will be described with reference to FIGS. 10 through 15.

In some example embodiments, when the write data is the read hot data, e.g., when a read operation for the write address and/or the write data is performed with a relatively large number of times, it may be determined that the write data corresponds to the second deterioration pattern, and thus a specific verification level may be changed (e.g., the optimal or improved verification level is selected) to improve and/or enhance the reliability of the write data. The read hot data may be data that is to be read relatively frequently, and a probability of being exposed to the read disturbance deterioration may be relatively high. Therefore, the reliability of the read hot data may be improved when the read hot data is more resistant or robust to the read disturbance deterioration. As described above, the read disturbance deterioration may affect the lower state, and thus, for the read hot data, the verification level may be controlled or adjusted to increase the margin for the lower state. Detailed operations of adjusting the verification level for the read hot data will be described with reference to FIGS. 16 through 20.

In some example embodiments, when selecting the optimal or improved verification level in operation S230, conditions affecting error bits of each page may be considered together. The unit of the read operation may be a page, and the degree to which a plurality of states affects the reliability (e.g., the degree of the error bits) may be different for each page. For example, a specific state of a specific page may have a greater influence on the error bits at the time of reading, and vice versa. Therefore, when the number of the error bits of the specific page increases, the verification level may be additionally adjusted to change the margin for the specific state that affects the error bits of the specific page.

After operations S230 and S240 are performed, the optimal or improved verification level and/or the offset information representing the optimal or improved verification level may be stored (operation S250). For example, the optimal or improved verification level and/or the offset information may be stored in a parameter storage unit included in a memory controller (e.g., the memory 420 included in the memory controller 400 in FIG. 6).

When the write data does not correspond to the distribution deterioration pattern and it is not required to change the verification level (operation S220: NO), the process may be terminated.

In some example embodiments, when the write data is the write hot data, e.g., when a write operation for the write address is performed with a relatively large number of times, it may be determined that the write data does not correspond to the first and second deterioration patterns. The write hot data may be data that is to be written relatively frequently and has a relatively high possibility of becoming invalid data, and a probability of being exposed to the data retention deterioration may be relatively low. Therefore, the write hot data may be programmed without adjusting the verification level.

In some example embodiments, when the write data is the read cold data, e.g., when a read operation for the write address and/or the write data is performed with a relatively small number of times, it may be determined that the write data does not correspond to the first and second deterioration patterns. The read cold data may be read relatively less, and a probability of being exposed to the read disturbance deterioration may be relatively low. Therefore, the read cold data may be programmed without adjusting the verification level.

Figure 9:
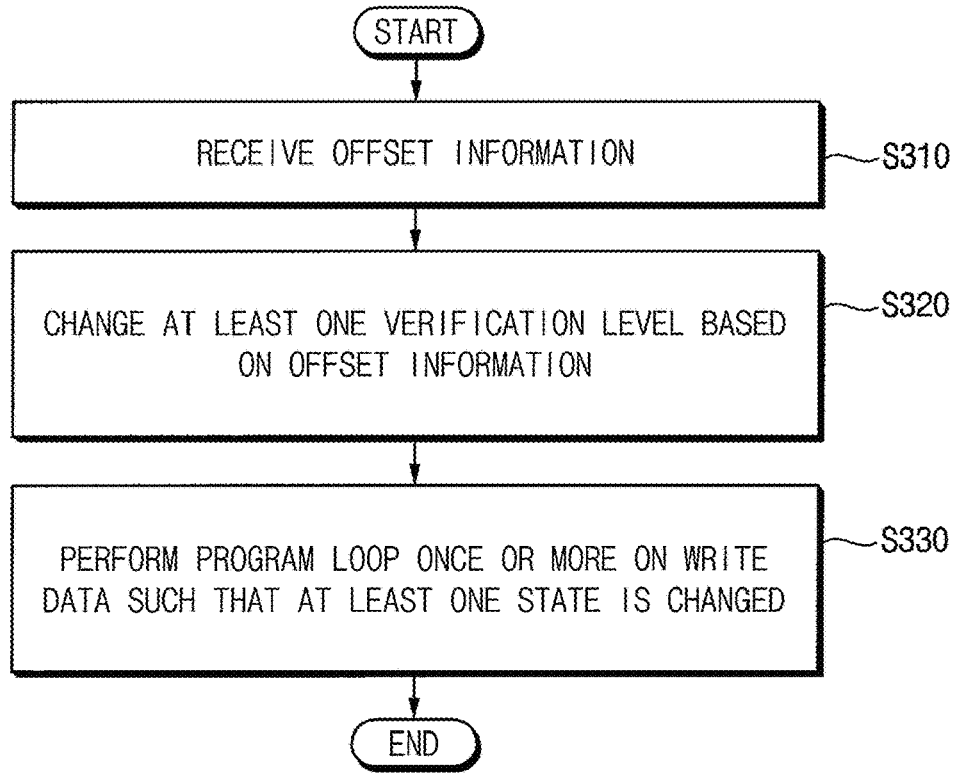
FIG. 9 is a flowchart illustrating an example of programming write data based on offset information in FIG. 1.

FIG. 9 is a flowchart illustrating an example of programming write data based on offset information in FIG. 1.

Referring to FIGS. 1 and 9, in operation S300, the offset information maybe received (operation S310). At least one verification level among a first verification level through an N-th verification level may be changed based on the offset information (operation S320). The first verification level through the N-th verification level may correspond to a first state through an N-th state, respectively, that are included in the distribution of threshold voltages of the memory cells in which the write data is stored. A program loop may be performed once or more times on the write data based on the first verification level through the N-th verification level including the changed verification level such that at least one state among the first state through the N-th state is changed (operation S330). The optimal or improved verification level may vary depending on the I/O pattern of the write data, and detailed operations will be described later.

Figure 10:
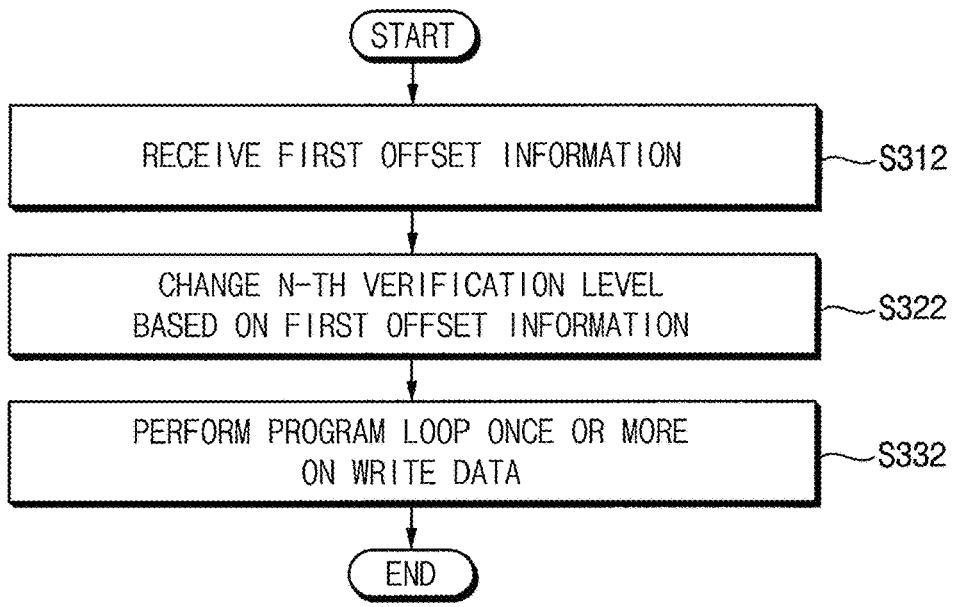
FIG. 10 is a flowchart illustrating an example of a program operation of FIG. 9.
Figure 11:
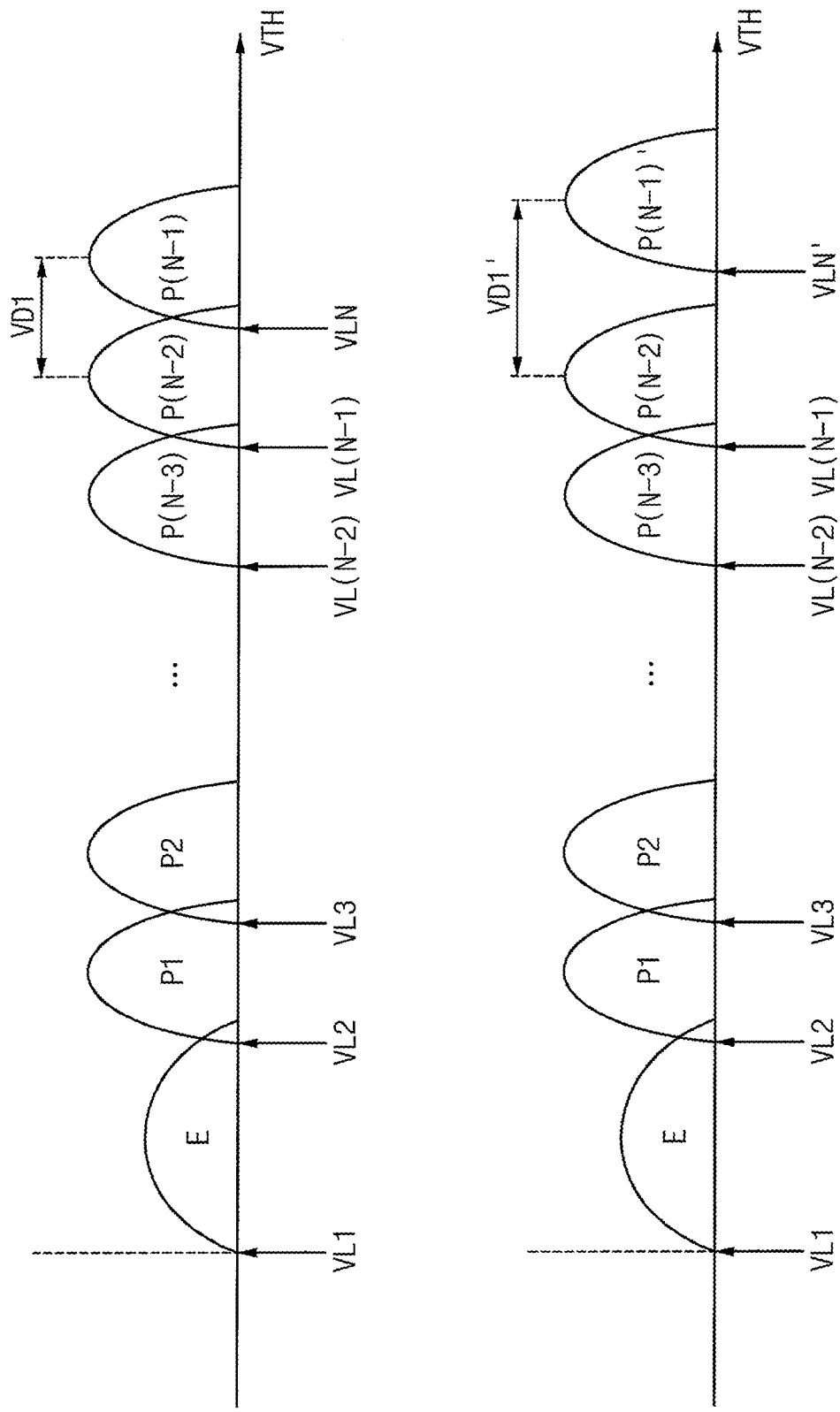
FIGS. 11 and 12 are diagrams for describing an operation of FIG. 10.
Figure 12:
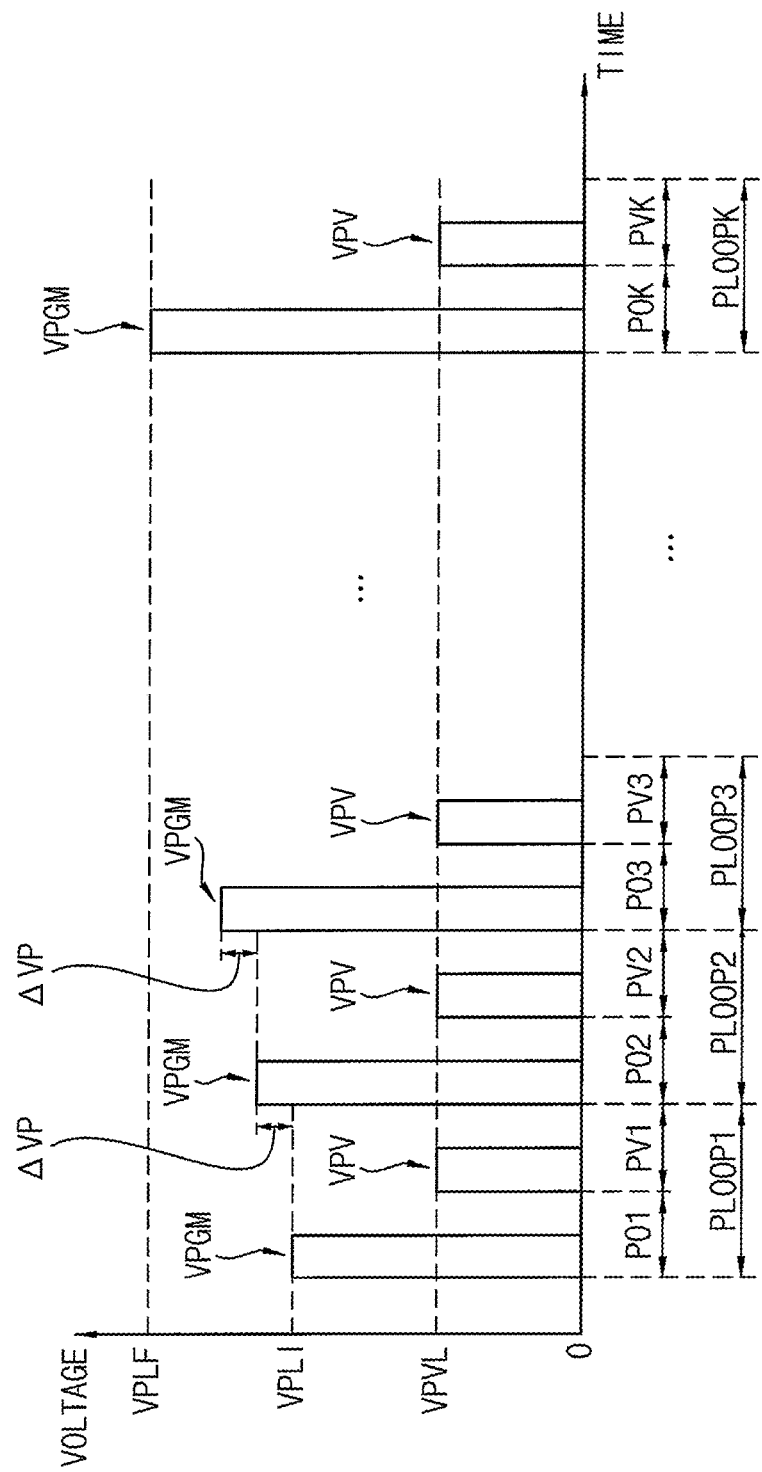

FIG. 10 is a flowchart illustrating an example of a program operation of FIG. 9. FIGS. 11 and 12 are diagrams for describing an operation of FIG. 10.

Referring to FIGS. 9, 10, 11 and 12, in operation S310, first offset information may be received (operation S312). For example, the first offset information may represent that the write data is the write cold data and corresponds to the first deterioration pattern, and may include an optimal or improved verification level for improving the reliability of the write cold data.

In operation S320, the N-th verification level among the first through N-th verification levels may be changed based on the first offset information such that the N-th state among the first through N-th states is changed (operation S322). Among the plurality of states and the plurality of verification levels, the first state and the first verification level may correspond to the lowest voltage level, and the N-th state and the N-th verification level may correspond to the highest voltage level. As described above, for the write cold data, the N-th verification level may be controlled or adjusted to increase the margin for the N-th state, which is the upper-most state.

In some example embodiments, the verification level may be adjusted as illustrated in FIG. 11. In a distribution of threshold voltages VTH illustrated in FIG. 11, first through N-th states E, P1, P2, . . . , P(N−3), P(N−2) and P(N−1) and first through N-th verification levels VL1, VL2, VL3, . . . , VL(N−2), VL(N−1) and VLN that are illustrated at the upper portion may represent an example before operation S322 is performed, e.g., a distribution of initial threshold voltages. In addition, first through N-th states E, P1, P2, . . . , P(N−3), P(N−2) and P(N−1)' and first through N-th verification levels VL1, VL2, VL3, . . . , VL(N−2), VL(N−1) and VLN' that are illustrated at the lower portion may represent an example after operation S322 is performed and the verification level is adjusted. For example, the first state E and the first verification level VL1 may represent an erase state and an erase verification level, and the second through N-th states P1 to P(N−1) and the second through N-th verification levels VL2 to VLN may represent program states and program verification levels. For example, when the memory cells are triple-level cells (TLCs), N may be eight.

For example, when operation S322 is performed, the N-th verification level that is the highest level may increase from VLN to VLN', and the N-th state that is the uppermost state may be changed from P(N−1) to P(N−1)'. In other words, only one program state and only one program verification level may be changed. Thus, an interval between the (N−1)-th state and the N-th state may increase from VD1 to VD1' (e.g., an interval between the (N−1)-th verification level and the N-th verification level may increase), and the reliability against the data retention deterioration may be improved as the margin for the N-th state increases. The rest or remainder of the states and the verification levels other than the N-th state and the N-th verification level may be maintained.

In operation S330, a program loop may be performed once or more times on the write data based on the first through N-th verification levels including the changed N-th verification level (operation S332). For example, the program loop may include a program operation and a program verification operation. For example, the program loop may be repeatedly performed to form the distribution of threshold voltages VTH illustrated in the lower portion of FIG. 11.

In some example embodiments, operation S332 may be performed based on an incremental operation pulse program (ISPP) scheme.

For example, as illustrated in FIG. 12, a plurality of program loops PLOOP1, PLOOP2, PLOOP3, . . . , PLOOPK may be sequentially performed, where K is a natural number greater than or equal to two. For each program loop, one of program operations P01, P02, P03, . . . , POK using a program voltage VPGM and a respective one of program verification operations PV1, PV2, PV3, . . . , PVK using a program verification voltage VPV may be sequentially performed. A level of the program voltage VPGM in a current program loop may be higher than that of the program voltage VPGM in a previous program loop, and the program verification voltage VPV may have a constant level (e.g., a verification level VPVL). For example, the verification level VPVL may correspond to one of the verification levels VL2 to VLN in FIG. 11.

For example, in the first program loop PLOOP1, the program voltage VPGM may have an initial program level VPLI. In the second program loop PLOOP2, the program voltage VPGM may have a level that is increased by a operation level ΔVP from the initial program level VPLI. In the third program loop PLOOP3, the program voltage VPGM may have a level that is increased by the operation level ΔVP from the level of the program voltage VPGM in the second program loop PLOOP2. In the K-th program loop PLOOPK which is the last program loop, the program voltage VPGM may have a final program level VPLF.

Although FIG. 12 illustrates that only the level of the program voltage VPGM increases as the program loop is repeatedly performed, example embodiments are not limited thereto, and the level of the program verification voltage VPV may also increase. In some example embodiments, the level of the program voltage VPGM may decrease and/or the level of the program verification voltage VPV may decrease as the program loop is repeatedly performed. In addition, although FIG. 12 illustrates that the level of the program voltage VPGM increases by a fixed level (e.g., the operation level ΔVP), example embodiments are not limited thereto, and the amount of change in the program voltage VPGM may be changed for each program loop.

Figure 13:
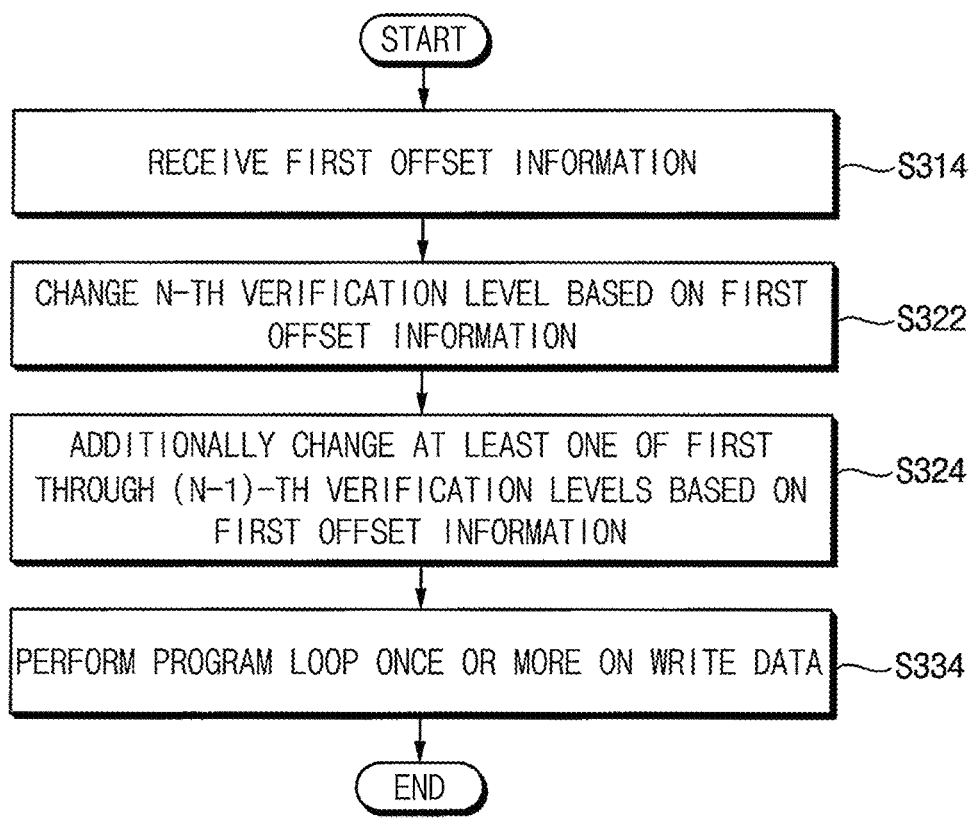
FIG. 13 is a flowchart illustrating another example of a program operation of FIG. 9.
Figure 14:
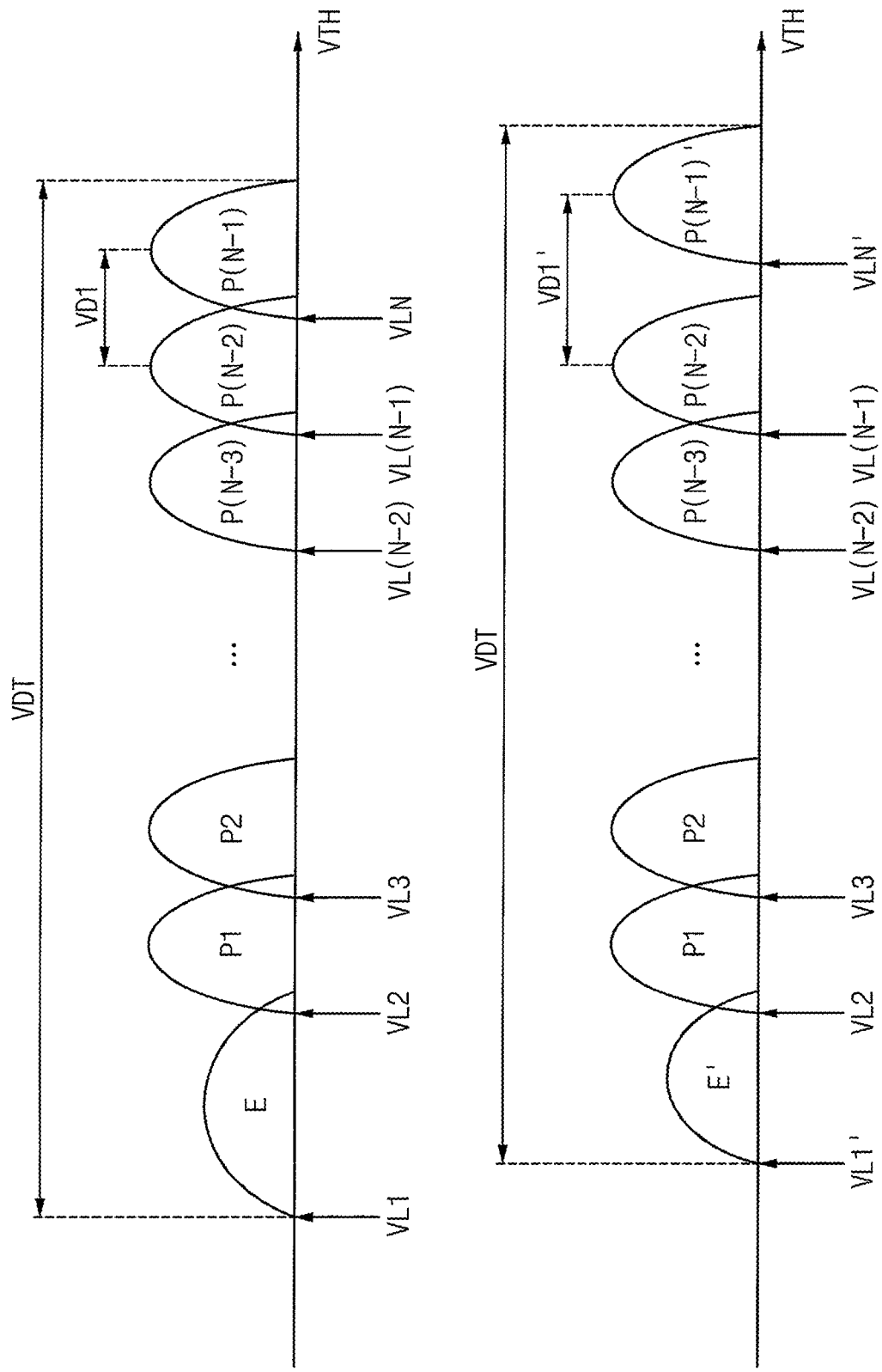
FIGS. 14 and 15 are diagrams for describing an operation of FIG. 13.
Figure 15:
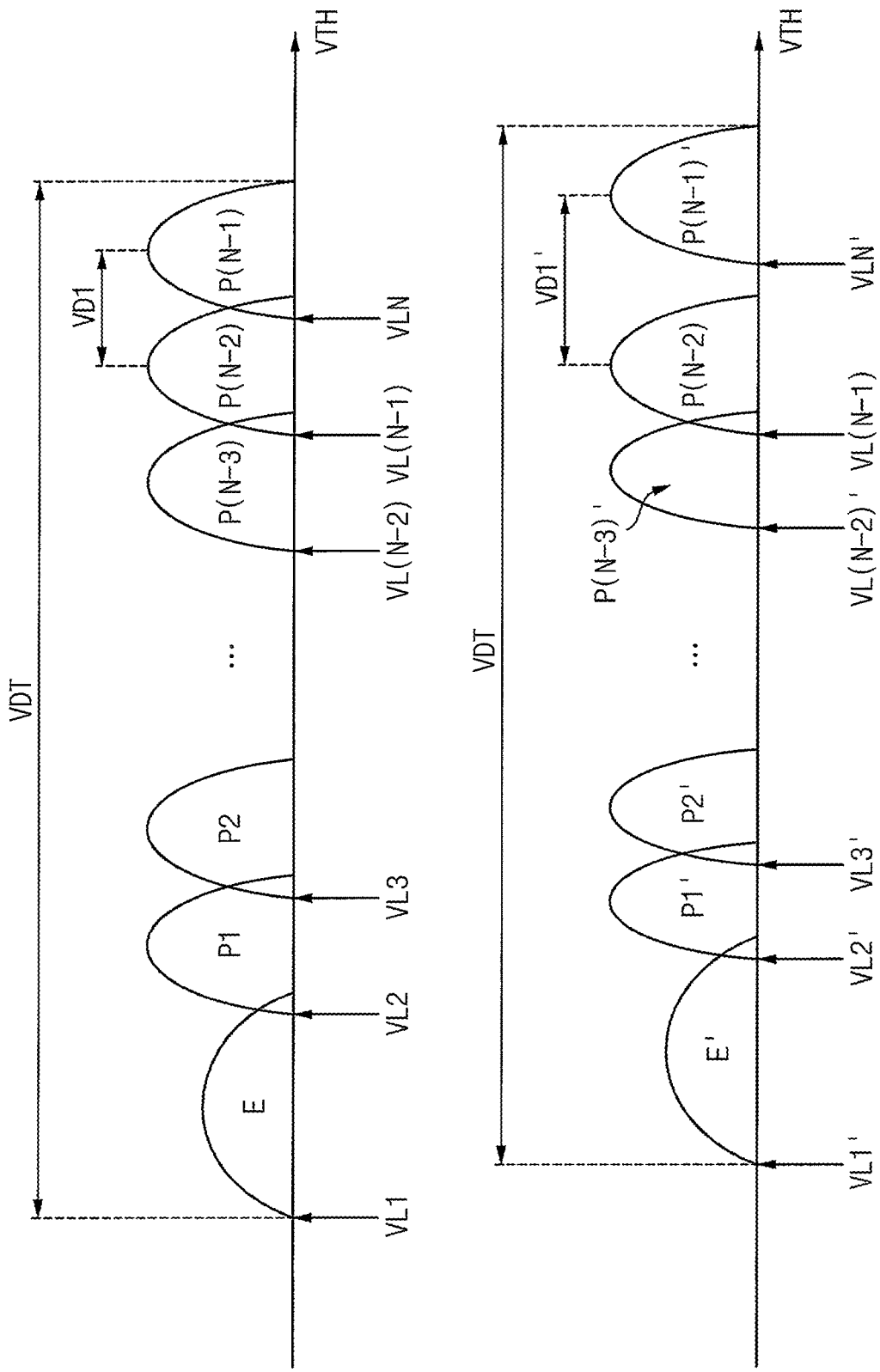

FIG. 13 is a flowchart illustrating another example of a program operation of FIG. 9. FIGS. 14 and 15 are diagrams for describing an operation of FIG. 13. The descriptions repeated with FIGS. 10, 11 and 12 will be omitted.

Referring to FIGS. 9, 13, 14 and 15, in operation S310, first offset information may be received (operation S314).

The first offset information in operation S314 may be similar to the first offset information in operation S312 of FIG. 10, except that an optimal or improved verification level included in the first offset information in operation S314 is different from the optimal or improved verification level included in the first offset information in operation S312.

In operation S320, operation S322 may be the same or substantially the same as operation S322 in FIG. 10. In addition, at least one of the first through (N−1)-th verification levels among the first through N-th verification levels other than the N-th verification level changed by operation S322 may be additionally changed based on the first offset information (operation S324). The entire width of the distribution of threshold voltages may be maintained even when the N-th verification level is adjusted to increase the margin for the N-th state by operation S322, and thus operation S324 may be additionally performed for maintaining the entire width of the distribution of threshold voltages.

In some example embodiments, the verification levels may be adjusted as illustrated in FIG. 14. In a distribution of threshold voltages VTH illustrated in FIG. 14, first through N-th states E', P1, P2, . . . , P(N−3), P(N−2) and P(N−1)' and first through N-th verification levels VL1', VL2, VL3, . . . , VL(N−2), VL(N−1) and VLN' that are illustrated at the lower portion may represent an example after operations S322 and S324 are performed and the verification levels are adjusted. For example, when operation S322 is performed, the N-th verification level may increase from VLN to VLN', and the N-th state may be changed from P(N−1) to P(N−1)'. In addition, when operation S324 is performed, the first verification level may increase from VL1 to VL1', and the first state may be changed from E to E'.

In other example embodiments, the verification levels may be adjusted as illustrated in FIG. 15. In a distribution of threshold voltages VTH illustrated in FIG. 15, first through N-th states E', P1', P2', . . . , P(N−3)', P(N−2) and P(N−1)' and first through N-th verification levels VL1', VL2', VL3', . . . , VL(N−2)', VL(N−1) and VLN' that are illustrated at the lower portion may represent an example after operations S322 and S324 are performed and the verification levels are adjusted. For example, when operation S322 is performed, the N-th verification level may increase from VLN to VLN', and the N-th state may be changed from P(N−1) to P(N−1)'. In addition, when operation S324 is performed, the first through (N−2)-th verification levels may increase from VL1, VL2, VL3, . . . , VL(N−2) to VL1', VL2', VL3', . . . , VL(N−2)', respectively, and the first through (N−2)-th states may be changed from E, P1, P2, . . . , P(N−3) to E', P1', P2', . . . , P(N−3)', respectively.

When the verification levels are adjusted as illustrated in FIGS. 14 and 15, the entire width of the distribution of threshold voltages VTH may be maintained to VDT while the margin for the N-th state increases.

In some example embodiments, even when operation S324 is additionally performed, all program verification levels and all program states may not be changed, and at least one program verification level and at least one program state may be maintained. For example, the program verification levels VL2 to VL(N−1) and the program states P1 to P(N−2) may not be changed and may be maintained in an example of FIG. 14, and the program verification level VL(N−1) and the program state P(N−2) may not be changed and may be maintained in an example of FIG. 15.

In operation S330, a program loop may be performed once or more times on the write data based on the first through N-th verification levels including the changed verification levels (operation S334). Operation S334 may be the same or substantially the same as operation S332 in FIG. 10. For example, the program loop may be repeatedly performed to form the distribution of threshold voltages VTH illustrated in the lower portion of FIG. 14 or FIG. 15.

Figure 16:
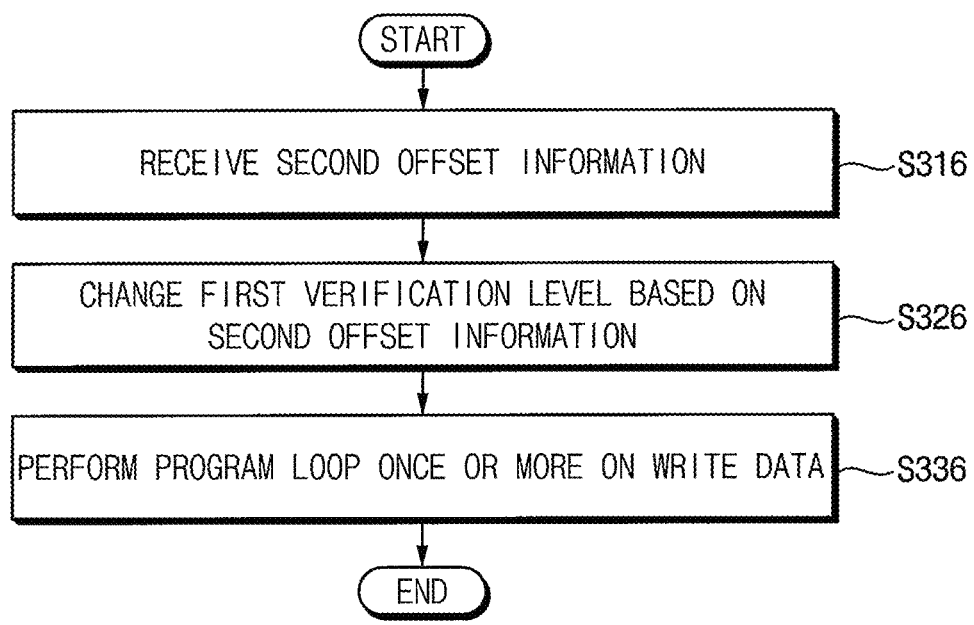
FIG. 16 is a flowchart illustrating still another example of a program operation of FIG. 9.
Figure 17:
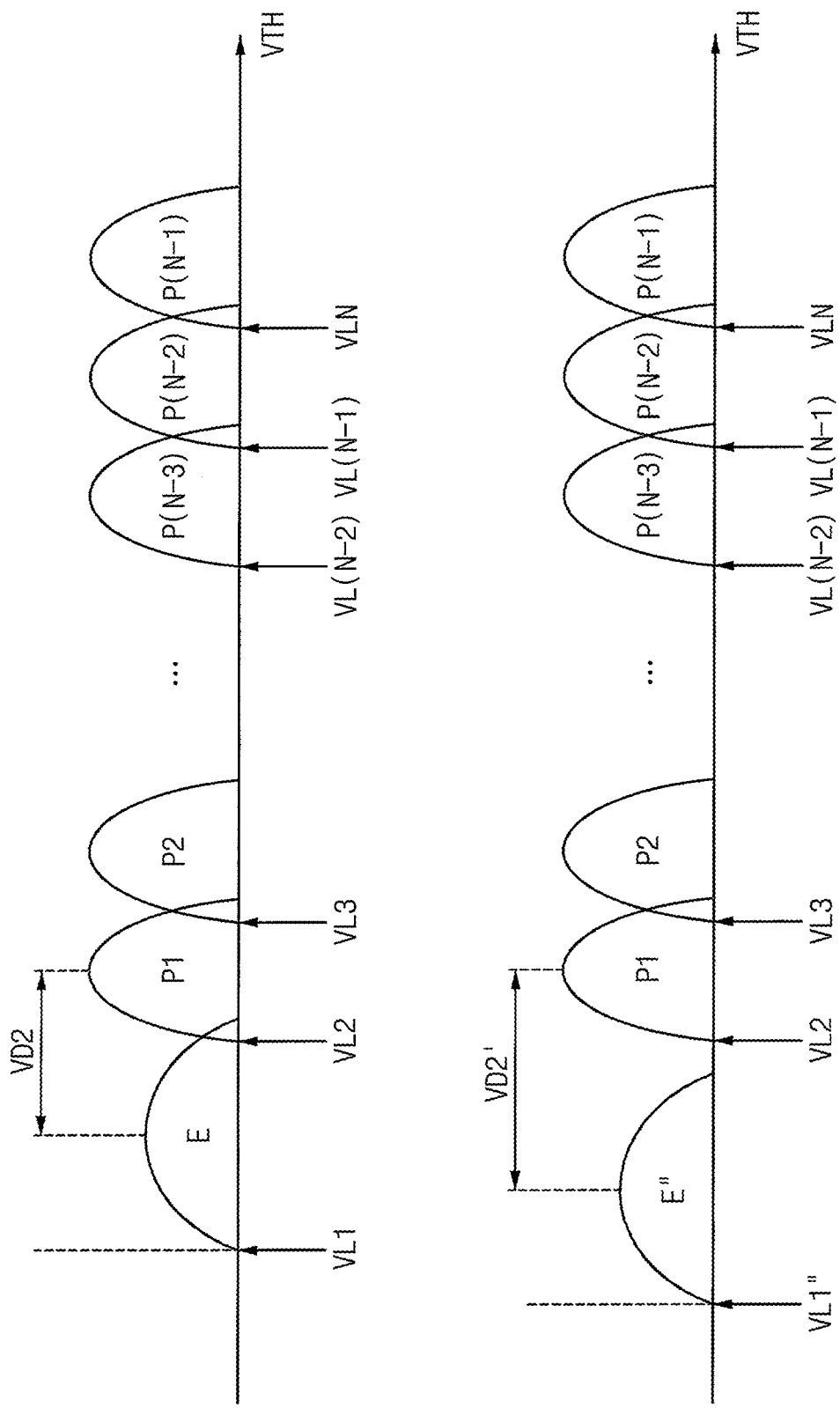
FIG. 17 is a diagram for describing an operation of FIG. 16.

FIG. 16 is a flowchart illustrating still another example of a program operation of FIG. 9. FIG. 17 is a diagram for describing an operation of FIG. 16. The descriptions repeated with FIGS. 10, 11 and 12 will be omitted.

Referring to FIGS. 9, 16 and 17, in operation S310, second offset information may be received (operation S316). For example, the second offset information may represent that the write data is the read hot data and corresponds to the second deterioration pattern, and may include an optimal or improved verification level for improving the reliability of the read hot data.

In operation S320, the first verification level among the first through N-th verification levels may be changed based on the second offset information such that the first state among the first through N-th states is changed (operation S326). As described above, for the read hot data, the first verification level may be controlled or adjusted to increase the margin for the first state, which is the lowermost state.

In some example embodiments, the verification level may be adjusted as illustrated in FIG. 17. In a distribution of threshold voltages VTH illustrated in FIG. 17, first through N-th states E", P1, P2, . . . , P(N−3), P(N−2) and P(N−1) and first through N-th verification levels VL1", VL2, VL3, . . . , VL(N−2), VL(N−1), VLN that are illustrated at the lower portion may represent an example after operation S326 is performed and the verification level is adjusted.

For example, when operation S326 is performed, the first verification level that is the lowest level may decrease from VL1 to VL1", and the first state that is the lowermost state may be changed from E to E". Thus, an interval between the first state and the second state may increase from VD2 to VD2' (e.g., an interval between the first verification level and the second verification level may increase), and the reliability against the read disturbance deterioration may be improved as the margin for the first state increases. The rest or remainder of the states and the verification levels other than the first state and the first verification level may be maintained.

In operation S330, a program loop may be performed once or more times on the write data based on the first through N-th verification levels including the changed first verification level (operation S336). Operation S336 may be the same or substantially the same as operation S332 in FIG. 10. For example, the program loop may be repeatedly performed to form the distribution of threshold voltages VTH illustrated in the lower portion of FIG. 17.

Figure 18:
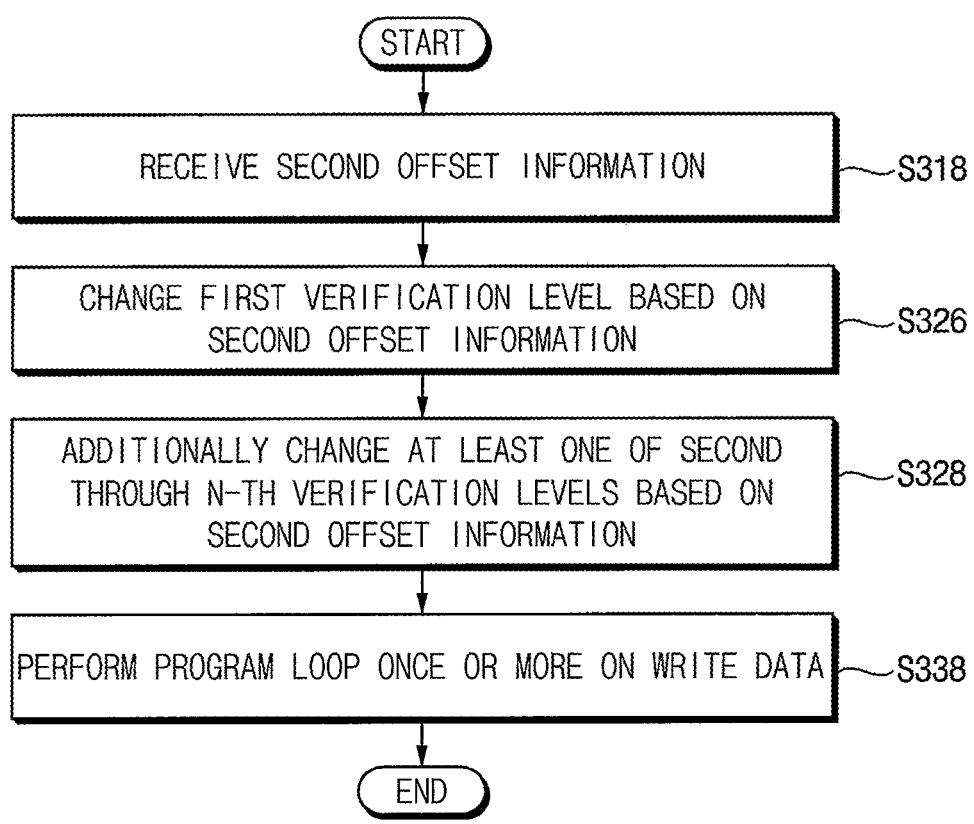
FIG. 18 is a flowchart illustrating still another example of a program operation of FIG. 9.
Figure 19:
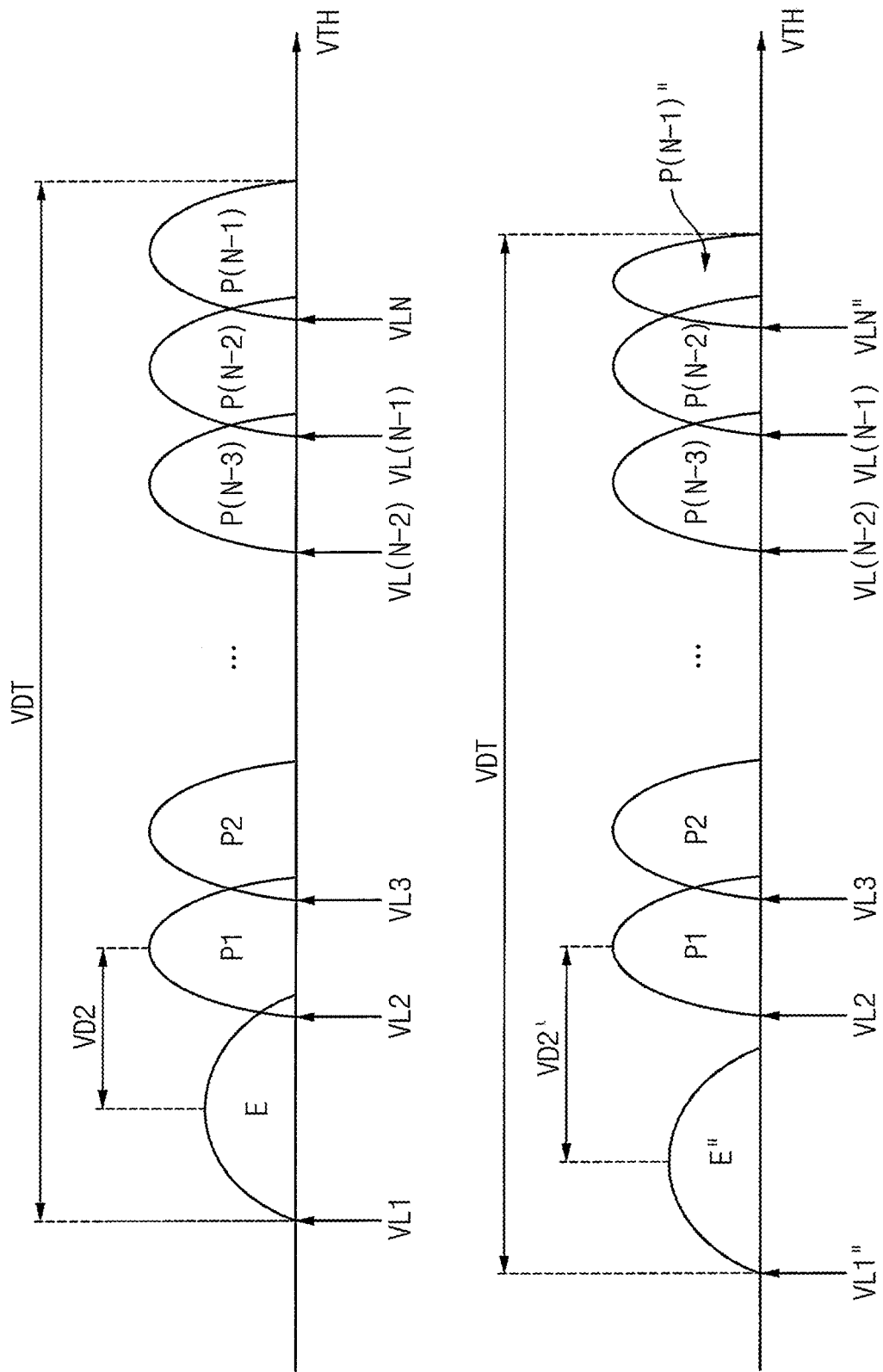
FIGS. 19 and 20 are diagrams for describing an operation of FIG. 18.
Figure 20:
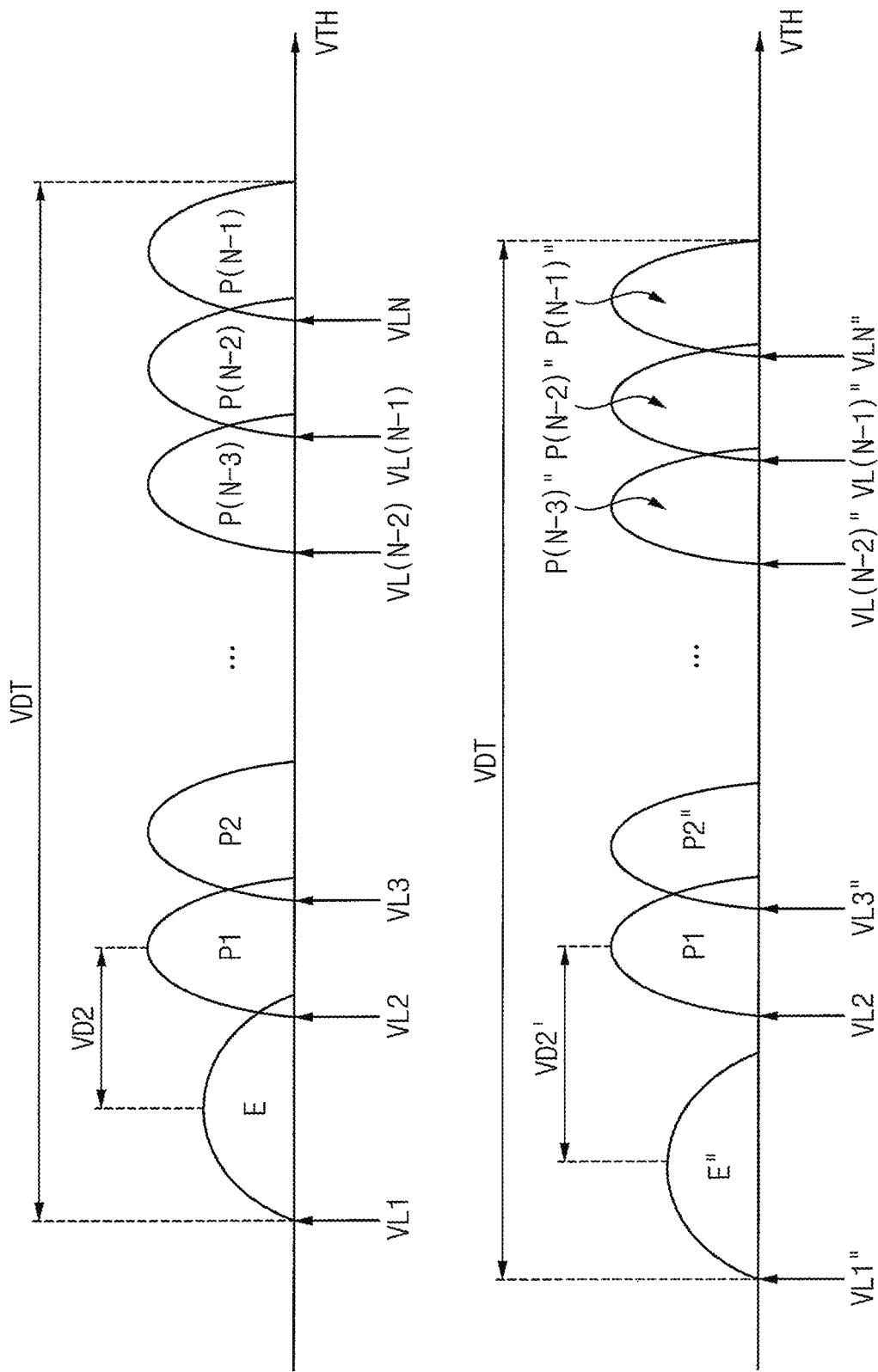

FIG. 18 is a flowchart illustrating still another example of a program operation of FIG. 9. FIGS. 19 and 20 are diagrams for describing an operation of FIG. 18. The descriptions repeated with FIGS. 10, 11, 12, 16 and 17 will be omitted.

Referring to FIGS. 9, 18, 19 and 20, in operation S310, second offset information may be received (operation S318). The second offset information in operation S318 may be similar to the second offset information in operation S316 of FIG. 16, except that an optimal or improved verification level included in the second offset information in operation S318 is different from the optimal or improved verification level included in the second offset information in operation S316.

In operation S320, operation S326 may be the same or substantially the same as operation S326 in FIG. 16. In addition, at least one of the second through N-th verification levels among the first through N-th verification levels other than the first verification level changed by operation S326 may be additionally changed based on the second offset information (operation S328). The entire width of the distribution of threshold voltages may be maintained even when the first verification level is adjusted to increase the margin for the first state by operation S326, and thus operation S328 may be additionally performed for maintaining the entire width of the distribution of threshold voltages.

In some example embodiments, the verification levels may be adjusted as illustrated in FIG. 19. In a distribution of threshold voltages VTH illustrated in FIG. 19, first through N-th states E", P1, P2, . . . , P(N−3), P(N−2) and P(N−1)" and first through N-th verification levels VL1", VL2, VL3, . . . , VL(N−2), VL(N−1) and VLN" that are illustrated at the lower portion may represent an example after operations S326 and S328 are performed and the verification levels are adjusted. For example, when operation S326 is performed, the first verification level may decrease from VL1 to VL1", and the first state may be changed from E to E". In addition, when operation S328 is performed, the N-th verification level may decrease from VLN to VLN", and the N-th state may be changed from P(N−1) to P(N−1)".

In other example embodiments, the verification levels may be adjusted as illustrated in FIG. 20. In a distribution of threshold voltages VTH illustrated in FIG. 20, first through N-th states E", P1, P2", . . . , P(N−3)", P(N−2)" and P(N−1)" and first through N-th verification levels VL1", VL2, VL3", . . . , VL(N−2)", VL(N−1)" and VLN" that are illustrated at the lower portion may represent an example after operations S326 and S328 are performed and the verification levels are adjusted. For example, when operation S326 is performed, the first verification level may decrease from VL1 to VL1", and the first state may be changed from E to E". In addition, when operation S328 is performed, the third through N-th verification levels may increase from VL3, . . . , VL(N−2), VL(N−1), VLN to VL3", . . . , VL(N−2)", VL(N−1)", VLN", respectively, and the third through N-th states may be changed from P2, . . . , P(N−3), P(N−2), P(N−1) to P2", . . . , P(N−3)", P(N−2)", P(N−1)", respectively.

When the verification levels are adjusted as illustrated in FIGS. 19 and 20, the entire width of the distribution of threshold voltages VTH may be maintained to VDT while the margin for the first state increases.

In some example embodiments, even when operation S328 is additionally performed, all program verification levels and all program states may not be changed, and at least one program verification level and at least one program state may be maintained. For example, the program verification levels VL2 to VL(N−1) and the program states P1 to P(N−2) may not be changed and may be maintained in an example of FIG. 19, and the program verification level VL2 and the program state P1 may not be changed and may be maintained in an example of FIG. 20.

In operation S330, a program loop may be performed once or more times on the write data based on the first through N-th verification levels including the changed verification levels (operation S338). Operation S338 may be the same or substantially the same as operation S336 in FIG. 16. For example, the program loop may be repeatedly performed to form the distribution of threshold voltages VTH illustrated in the lower portion of FIG. 19 or FIG. 20.

Although example embodiments are described with reference to FIGS. 10 through 15 that only the margin for the N-th state increases (e.g., only the interval between the (N−1)-th state and the N-th state increases from VD1 to VD1'), and although example embodiments are described with reference to FIGS. 16 through 20 that only the margin for the first state increases (e.g., only the interval between the first state and the second state increases from VD2 to VD2'), example embodiments are not limited thereto, and the margin for at least one of other states may be additionally changed. For example, as described with reference to FIG. 8, the margin for at least one of other states that affects the error bits of each page may be additionally changed.

Although example embodiments are described with reference to FIGS. 8 through 20 based on specific I/O patterns of the write data, specific deterioration patterns, specific distributions of threshold voltages and specific verification levels, example embodiments are not limited thereto. For example, example embodiments may be extended, applied or employed to examples where an arbitrary verification level in an arbitrary distribution of threshold voltages is adjusted to improve the reliability when the I/O pattern of the write data corresponds to an arbitrary deterioration pattern that causes the variation of distribution.

Figure 21:
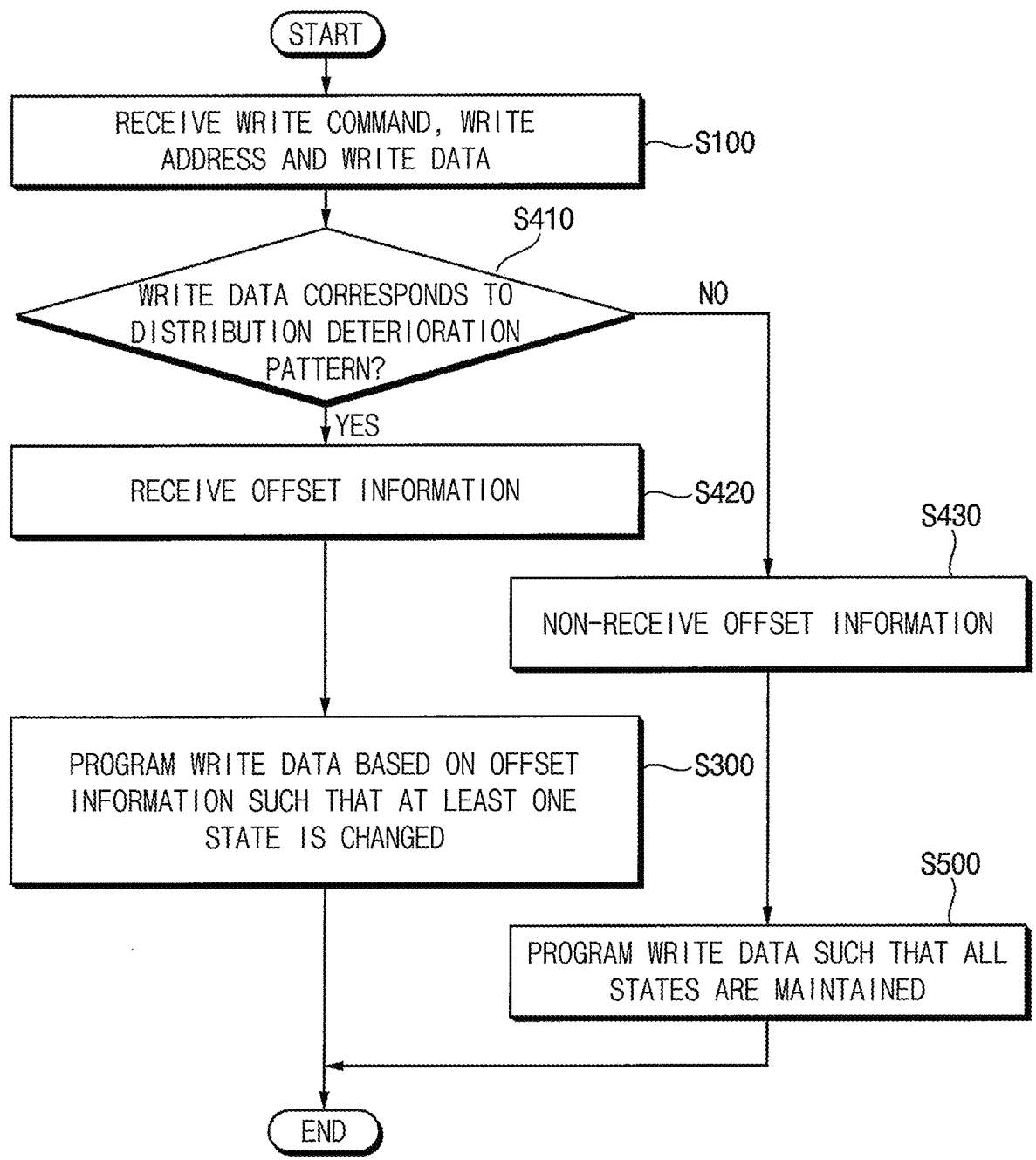
FIGS. 21 and 22 are flowcharts illustrating a method of writing data in a nonvolatile memory device according to example embodiments.
Figure 22:
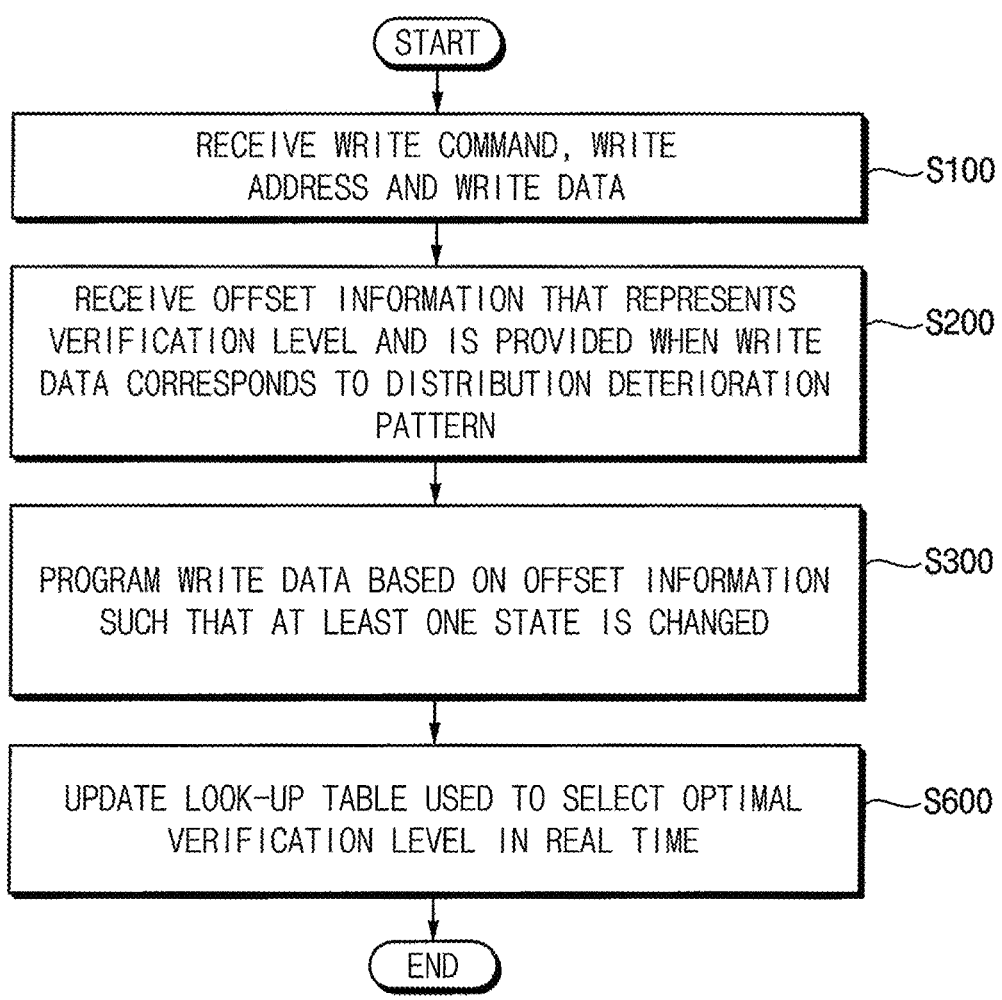

FIGS. 21 and 22 are flowcharts illustrating a method of writing data in a nonvolatile memory device according to example embodiments. The descriptions repeated with FIG. 1 will be omitted.

Referring to FIG. 21, in a method of writing data in a nonvolatile memory device according to example embodiments, operation S100 may be the same or substantially the same as operation S100 in FIG. 1.

It is determined, by checking the I/O pattern of the write data, whether the write data corresponds to the distribution deterioration pattern (operation S410).

When the write data corresponds to the distribution deterioration pattern (operation S410: YES), the offset information is received (operation S420). Operations S410 and S420 may correspond to operation S200 in FIG. 1. Operation S300 performed when the offset information is received may be the same or substantially the same as operation S300 in FIG. 1.

When the write data does not correspond to the distribution deterioration pattern (operation S410: NO), the offset information is not received (or non-received) (operation S430). When the offset information is not received, the write data is programmed such that all of the plurality of states included in the distribution of threshold voltages of the memory cells in which the write data is stored are maintained (operation S500). For example, the program loop may be repeatedly performed to form the distribution of threshold voltages VTH illustrated in the upper portion of FIG. 11.

Referring to FIG. 22, in a method of writing data in a nonvolatile memory device according to example embodiments, operations S100, S200 and S300 may be the same or substantially the same as operations S100, S200 and S300 in FIG. 1, respectively.

The look-up table used to select the optimal or improved verification level is updated in real time (operation S600). The look-up table may be used to generate the offset information in operation S200, and may be used to perform operation S230 in FIG. 8. For example, the look-up table 436 in FIG. 6 may correspond to the look-up table in operation S600.

In some example embodiments, the look-up table may be updated in real time based on program/erase (P/E) cycle information. In other example embodiments, the look-up table may be updated in real time based on at least one of other information associated with operations and/or characteristics of the nonvolatile memory device.

As will be appreciated by those skilled in the art, the inventive concepts may be embodied as a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain or store a program for use by or in connection with an instruction execution system, apparatus, or device. For example, the computer readable medium may be a non-transitory computer readable medium.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

FIG. 23 is a block diagram illustrating a storage device and a storage system including the storage device according to example embodiments.

Referring to FIG. 23, a storage system 1000 includes a host device 1100 and a storage device 1200.

The host device 1100 controls overall operations of the storage system 1000. Although not illustrated in FIG. 23, the host device 1100 may include a host processor and a host memory. The host processor may control an operation of the host device 1100. For example, the host processor may execute an operating system (OS). The host memory may store instructions and/or data that are executed and/or processed by the host processor. For example, the operating system executed by the host processor may include a file system for file management and a device driver for controlling peripheral devices including the storage device 1200 at the operating system level.

The storage device 1200 is accessed by the host device 1100. The storage device 1200 includes a storage controller 1210, a plurality of nonvolatile memories (NVMs) 1220a, 1220b and 1220c, and a buffer memory 1230.

The storage controller 1210 may control an operation of the storage device 1200 and/or operations of the plurality of nonvolatile memories 1220a, 1220b and 1220c based on a command and data that are received from the host device 1100. The plurality of nonvolatile memories 1220a, 1220b and 1220c may store a plurality of data. For example, the plurality of nonvolatile memories 1220a, 1220b and 1220c may store meta data, various user data, or the like. The buffer memory 1230 may store instructions and/or data that are executed and/or processed by the storage controller 1210, and may temporarily store data stored in or to be stored into the plurality of nonvolatile memories 1220a, 1220b and 1220c. The memory system 10 of FIG. 2 and/or the memory system 50 of FIG. 7 may be implemented in the form of the storage device 1200. For example, the storage controller 1210 may correspond to the memory controller 20 in FIG. 2 and/or the memory controller 600 in FIG. 7, and the nonvolatile memories 1220a, 1220b and 1220c may correspond to the nonvolatile memory device 40 in FIG. 2 and/or the memory device 500 in FIG. 7.

A parameter manager (PM) 1212 included in the storage controller 1210 may correspond to the parameter manager 430 in FIG. 6. In some example embodiments, the storage controller 1210 may further include a neural processing unit (NPU) 1214 for detecting the I/O pattern of the write data.

In some example embodiments, the storage device 1200 may be a solid state drive (SSD), a universal flash storage (UFS), a multi-media card (MMC) or an embedded multi-media card (eMMC). In other example embodiments, the storage device 1200 may be one of a secure digital (SD) card, a micro SD card, a memory stick, a chip card, a universal serial bus (USB) card, a smart card, a compact flash (CF) card, or the like.

The inventive concepts may be applied to various electronic devices and systems that include the nonvolatile memory devices and the storage devices. For example, the inventive concepts may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of writing data in a nonvolatile memory device, the method comprising:
receiving a write command, a write address and write data to be programmed;
receiving offset information representing a verification level, the receiving the offset information including,
checking an input/output (I/O) pattern of the write data and determining whether the write data corresponds to a distribution deterioration pattern based on results of the checking the I/O pattern of the write data,
in response to the write data not corresponding to the distribution deterioration pattern, not receiving the offset information, and
in response to the offset information not being received, programming the write data such that all of a plurality of states are maintained, the plurality of states corresponding to a distribution of threshold voltages of memory cells; and
in response to the offset information being received, programming the write data based on the offset information such that at least one state among the plurality of states included in the distribution of threshold voltages of memory cells in which the write data is stored is changed.

2. The method of claim 1, wherein the distribution deterioration pattern includes a first deterioration pattern associated with data retention characteristic and a second deterioration pattern associated with read disturbance characteristic.

3. The method of claim 2, wherein:
in response to the write data being write cold data that is written less than a first number of times, the write data is determined to correspond to the first deterioration pattern, and
in response to the write data being read hot data that is read more than a second number of times, the write data is determined to correspond to the second deterioration pattern.

4. The method of claim 2, wherein:
the plurality of states include a first state through an N-th state, where N is a natural number greater than or equal to two,
the first state corresponds to a lowest voltage level, and the N-th state corresponds to a highest voltage level,
in response to the write data corresponding to the first deterioration pattern, the write data is programmed such that an interval between an (N−1)-th and the N-th state increases, and
in response to the write data corresponding to the second deterioration pattern, the write data is programmed such that an interval between the first state and a second state increases.

5. The method of claim 1, wherein the receiving the offset information includes:
detecting the I/O pattern of the write data;
determining whether to change the verification level based on the write data corresponding to the distribution deterioration pattern; and
in response to results of the determining indicating the write data corresponds to the distribution deterioration pattern, selecting an improved verification level; and
generating and providing the offset information including the improved verification level.

6. The method of claim 5, wherein the I/O pattern of the write data is detected based on the write address.

7. The method of claim 5, wherein the I/O pattern of the write data is detected based on a number of times the write data is accessed.

8. The method of claim 5, wherein the improved verification level is selected based on a desired look-up table (LUT).

9. The method of claim 8, further comprising:
updating the LUT used to select the improved verification level in real time.

10. The method of claim 5, wherein receiving the offset information further includes:
storing the improved verification level.

11. The method of claim 1, wherein:
the plurality of states includes a first state through an N-th state, where N is a natural number greater than or equal to two,
the first state corresponds to a lowest voltage level, and the N-th state corresponds to a highest voltage level, and
the programming the write data includes:
changing an N-th verification level among a first verification level through the N-th verification level based on the offset information such that the N-th state is changed, the first verification level through the N-th verification level corresponding to the first state through the N-th state, respectively; and performing a program loop once or more on the write data based on the first verification level through the N-th verification level including the changed N-th verification level.

12. The method of claim 11, wherein the N-th verification level increases, and an interval between an (N−1)-th state and the N-th state increases.

13. The method of claim 11, wherein the programming the write data further includes:
additionally changing at least one of the first verification level through an (N−1)-th verification level based on the offset information.

14. The method of claim 13, wherein an entire width of the distribution of threshold voltages is maintained in response to at least one of the first verification level through the N-th verification level being changed.

15. The method of claim 1, wherein:
the plurality of states includes a first state through an N-th state, where N is a natural number greater than or equal to two,
the first state corresponds to a lowest voltage level, and the N-th state corresponds to a highest voltage level, and
the programming the write data includes:
changing a first verification level among the first verification level through an N-th verification level based on the offset information such that the first state is changed, the first verification level through the N-th verification level corresponding to the first state through the N-th state, respectively; and
performing a program loop once or more on the write data based on the first verification level through the N-th verification level including the changed first verification level.

16. The method of claim 15, wherein the first verification level decreases, and an interval between the first state and a second state increases.

17. The method of claim 15, wherein
additionally changing at least one of a second verification level through the N-th verification level based on the offset information.

18. A nonvolatile memory device comprising:
a memory cell array including a plurality of memory cells; and
processing circuitry configured to,
receive a write command, a write address and write data to be programmed,
receive offset information representing a verification level, the receiving the offset information including,
checking an input/output (I/O) pattern of the write data and determining whether the write data corresponds to a distribution deterioration pattern based on results of the checking the I/O pattern of the write data,
in response to the write data not corresponding to the distribution deterioration pattern, not receiving the offset information, and
in response to the offset information not being received, programming the write data such that all of a plurality of states are maintained, the plurality of states corresponding to a distribution of threshold voltages of memory cells, and
program the write data based on the offset information in response to the offset information being received such that at least one state among the plurality of states included in the distribution of threshold voltages of memory cells in which the write data is stored is changed.

19. A method of operating a memory system including a memory controller and a nonvolatile memory device, the method comprising:
transmitting, by the memory controller, a write command, a write address and write data to be programmed to the nonvolatile memory device;
detecting, by the memory controller, an input/output (I/O) pattern of the write data;
selecting, by the memory controller, an improved verification level in response to a determination that the write data is write cold data or read hot data, the write cold data being data that is written less than a first number of times, the read hot data being data that is read more than a second number of times;
generating, by the memory controller, offset information including the improved verification level;
transmitting, by the memory controller, the offset information to the nonvolatile memory device;
changing, by the nonvolatile memory device, at least one of a first verification level through an N-th verification level based on the offset information, the first verification level through the N-th verification level corresponding to a first state through an N-th state, respectively, that are included in a distribution of threshold voltages; and
performing, by the nonvolatile memory device, a program loop once or more on the write data based on the first verification level through the N-th verification level such that at least one state among the first state through the N-th state is changed,
wherein the first state corresponds to a lowest voltage level, and the N-th state corresponds to a highest voltage level,
wherein, in response to the write data being the write cold data, the at least one state is changed such that an interval between an (N−1)-th state and the N-th state increases, and
wherein, in response to the write data being the read hot data, the at least one state is changed such that an interval between the first state and a second state increases.

* * * * *